(12) United States Patent
Tanaka

(10) Patent No.: US 11,057,016 B2
(45) Date of Patent: Jul. 6, 2021

(54) ACOUSTIC WAVE ELEMENT AND ACOUSTIC WAVE DEVICE

(71) Applicant: KYOCERA Corporation, Kyoto (JP)

(72) Inventor: Hiroyuki Tanaka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 606 days.

(21) Appl. No.: 15/762,982

(22) PCT Filed: Sep. 23, 2016

(86) PCT No.: PCT/JP2016/078030
§ 371 (c)(1),
(2) Date: Mar. 23, 2018

(87) PCT Pub. No.: WO2017/051874
PCT Pub. Date: Mar. 30, 2017

(65) Prior Publication Data
US 2019/0109579 A1    Apr. 11, 2019

(30) Foreign Application Priority Data

Sep. 25, 2015  (JP) .............................. JP2015-188134

(51) Int. Cl.
*H03H 9/145*     (2006.01)
*H03H 9/25*      (2006.01)
*H03H 9/02*      (2006.01)

(52) U.S. Cl.
CPC ...... *H03H 9/14541* (2013.01); *H03H 9/1457* (2013.01); *H03H 9/14514* (2013.01); *H03H 9/25* (2013.01); *H03H 9/02574* (2013.01)

(58) Field of Classification Search
CPC .......... H03H 9/14541; H03H 9/14514; H03H 9/1457; H03H 9/02535
(Continued)

(56) References Cited

U.S. PATENT DOCUMENTS 5,905,324 A * 5/1999 Shiba .................. H03H 9/6406
310/313 B
5,998,907 A * 12/1999 Taguchi ............. H03H 9/02574
310/313 R
(Continued)

FOREIGN PATENT DOCUMENTS

JP       2004-007095 A      1/2004
JP       2005-252550 A      9/2005
(Continued)

OTHER PUBLICATIONS

International Search Report dated Dec. 20, 2016, issued by Japan Patent Office for International Application No. PCT/JP2016/078030.

*Primary Examiner* — Derek J Rosenau
(74) *Attorney, Agent, or Firm* — Procopio Cory Hargreaves and Savitch LLP

(57) ABSTRACT

An acoustic wave element of the present invention includes a substrate; and an IDT electrode on an upper surface of the substrate, including a first bus bar, a second bus bar arranged with a space in a first direction from the first bus bar, a plurality of first electrode fingers connected to the first bus bar, a plurality of second electrode fingers connected to the second bus bar, and a second dummy electrode finger facing a tip end of one of the first electrode fingers through a gap. In at least one of the second electrode fingers, a width in a region on the side closer to the second bus bar than a first virtual line connecting the tip ends of the plurality of first electrode fingers is wider than a width in a region on the side closer to the first bus bar than the first virtual line.

8 Claims, 13 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2005/0194864 A1 | 9/2005 | Miura et al. |
| 2009/0267707 A1* | 10/2009 | Miura .................. H03H 9/1452 333/193 |
| 2010/0236322 A1* | 9/2010 | Kogai .................. G01N 29/022 73/53.01 |
| 2011/0193655 A1 | 8/2011 | Kamiguchi et al. |
| 2012/0286624 A1 | 11/2012 | Ikeuchi |
| 2013/0051588 A1* | 2/2013 | Ruile ....................... H03H 3/08 381/190 |
| 2015/0365067 A1 | 12/2015 | Hori et al. |
| 2016/0261038 A1 | 9/2016 | Tanaka |

FOREIGN PATENT DOCUMENTS

| | | |
|---|---|---|
| JP | 2008-035220 A | 2/2008 |
| WO | 2010/098065 A1 | 9/2010 |
| WO | 2011/108229 A1 | 9/2011 |
| WO | 2014/148648 A1 | 9/2014 |
| WO | 2015/064238 A1 | 5/2015 |

\* cited by examiner

ACOUSTIC WAVE ELEMENT AND ACOUSTIC WAVE DEVICE

TECHNICAL FIELD

The present disclosure relates to a surface acoustic wave (SAW) element or another acoustic wave element and an acoustic wave device using the same.

BACKGROUND ART

As an acoustic wave element, there is known one having a thin piezoelectric substrate, an IDT (InterDigital Transducer) provided on a major surface of the piezoelectric substrate, and a substrate which is bonded to the surface of the piezoelectric substrate on the opposite side and is made of a material having a thermal expansion coefficient smaller than that of the piezoelectric substrate (for example Patent Literature 1). Such an acoustic wave element is utilized in for example a transmission filter, receiving filter, etc. in a multiplexer. The IDT electrode is provided with for example a pair of facing bus bars, pluralities of electrode fingers alternately extending from the bus bars toward the other bus bar sides, and dummy electrodes which extend in the extension directions of these electrode fingers from the other bus bars.

As known, in such an acoustic wave element, the piezoelectric substrate is thin, therefore spurious emission corresponding to a bulk wave generated in a thickness direction is generated resulting in loss.

CITATION LIST

Patent Literature

Patent Literature 1: Japanese Patent Publication No. 2005-252550A

SUMMARY OF INVENTION

Technical Problem

In such a situation, it has been desired to provide an acoustic wave element suppressing loss. Therefore, an object of the present invention is to provide an acoustic wave element suppressing loss.

Solution to Problem

An acoustic wave element as set forth in one aspect of the present disclosure includes a substrate made of a piezoelectric crystal, an IDT electrode, and a support substrate. The IDT electrode includes a first bus bar, a second bus bar, a plurality of first electrode fingers, a plurality of second electrode fingers, a first dummy electrode finger, and a second dummy electrode finger all located on an upper surface of the substrate. Here, the first bus bar is connected to a first potential. The second bus bar is connected to a second potential and is located with a space in a first direction from the first bus bar. The plurality of first electrode fingers are connected to the first bus bar and extend toward the second bus bar side. The plurality of second electrode fingers are connected to the second bus bar and extend toward the first bus bar side. The first dummy electrode finger is connected to the first bus bar and faces a tip end of one of the second electrode fingers through a gap. The second dummy electrode finger is connected to the second bus bar and faces a tip end of one of the first electrode fingers through a gap. The support substrate is joined to a lower surface of the substrate, has a greater thickness than the substrate, and is made of a material having a smaller thermal expansion coefficient than that of the substrate. Further, a width of at least one of the first electrode fingers, the second electrode fingers, the first dummy electrode finger, and the second dummy electrode finger outside an intersection area surrounded by a first virtual line connecting the tip ends of the plurality of first electrode fingers and by a second virtual line connecting the tip ends of the plurality of second electrode fingers is wider than a widths of the first electrode fingers and the second electrode fingers in the intersection area.

An acoustic wave device according to another aspect of the present disclosure includes the above acoustic wave element and a circuit board on which the acoustic wave element is mounted.

Advantageous Effects of Invention

According to the above configuration, it is possible to provide an acoustic wave element and acoustic wave device suppressing occurrence of loss.

BRIEF DESCRIPTION OF DRAWINGS

FIG. 2 FIG. 2A is a cross-sectional view of a principal part taken along the IIa-IIa line in FIG. 1.

FIG. 3 FIG. 3A is a graph showing the relationships between the gaps and the phase characteristic of a resonator when using a bonded substrate, while

FIG. 7 FIG. 7A to FIG. 7E are schematic diagrams showing models of electrode finger shape.

DESCRIPTION OF EMBODIMENTS

Figure 1:
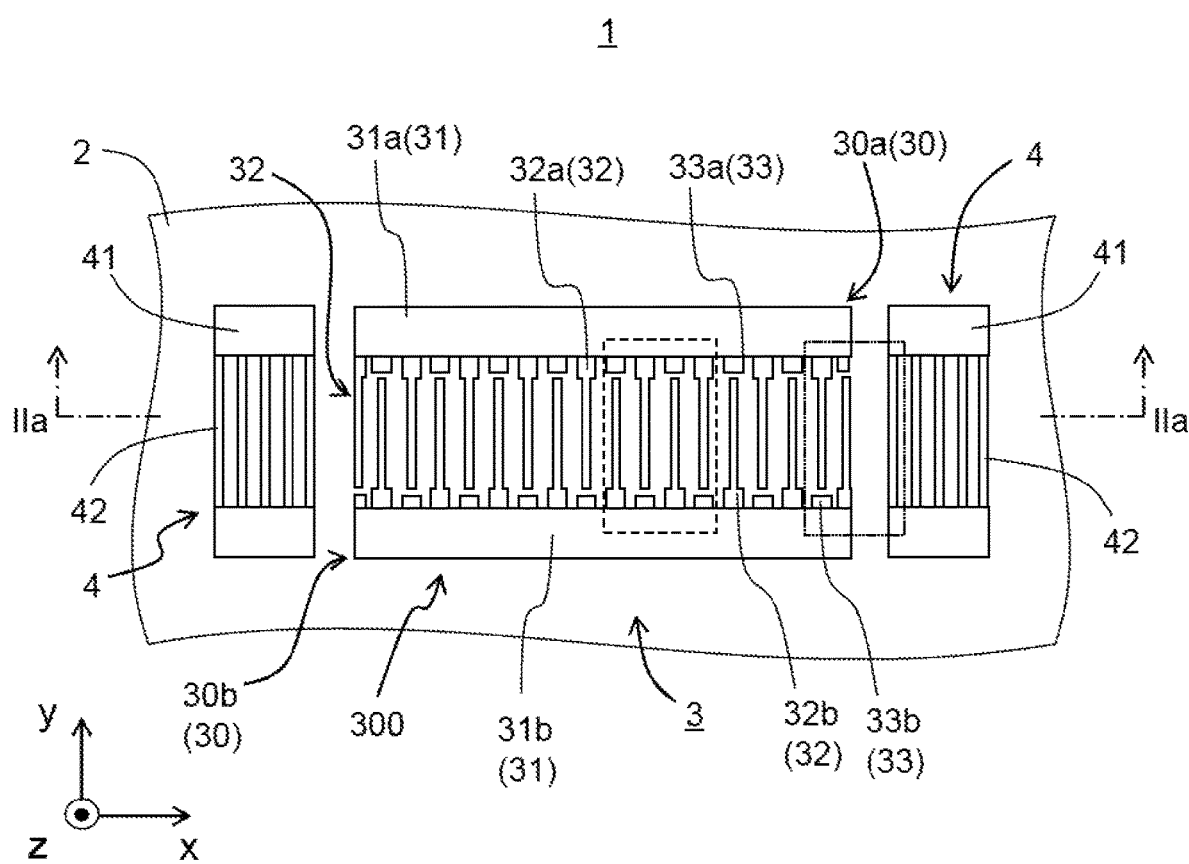
FIG. 1 A plan view of an acoustic wave element of the present invention.

Below, an acoustic wave element according to an embodiment of the present disclosure and an acoustic wave device using the same will be explained with reference to the drawings. Note that, the drawings used in the following explanation are schematic ones. Dimension ratios etc. in the drawings do not always coincide with the actual ones.

In the acoustic wave element, any direction may be defined as the "above" or "below". In the following description, however, for convenience, an orthogonal coordinate system xyz will be defined, and the "upper surface", "lower surface", and other terms will be used where the positive side of the z-direction is the upper part. Further, in the following examples, the explanation will be given with reference to an example of an element exciting the surface acoustic wave among the acoustic waves, and the acoustic wave element will be sometimes abbreviated as a "SAW element".

<Outline of Configuration of Acoustic Wave Element>

Figure 2A:
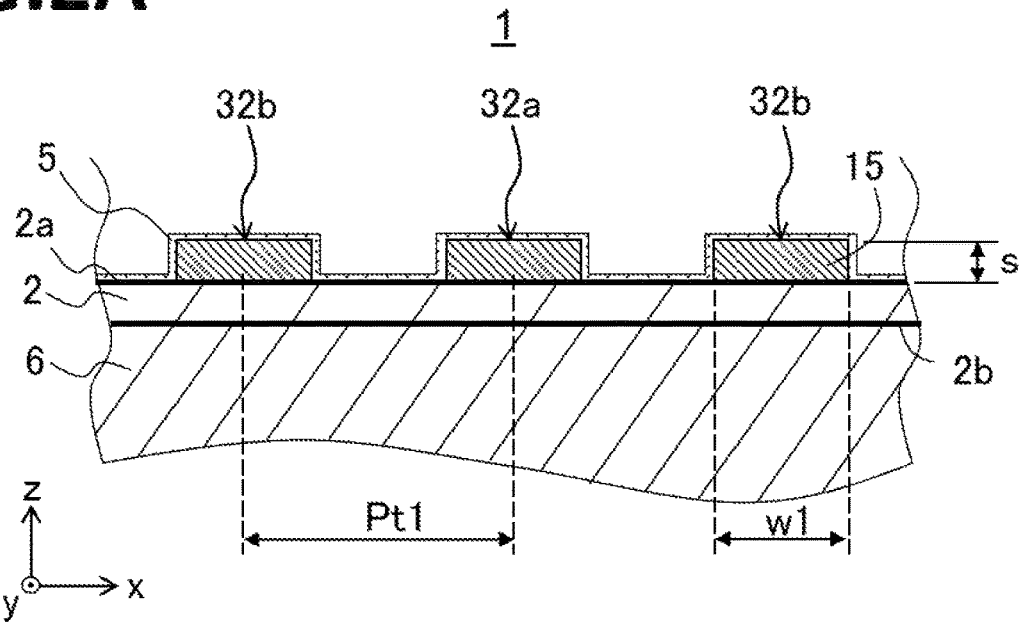

FIG. 1 is a plan view showing the configuration of a SAW element 1 according to an embodiment of the present invention. FIG. 2A is an enlarged cross-sectional view of a principal part taken along the IIa-IIa line in FIG. 1, and FIG. 2B is a diagram enlarging a region surrounded by a broken line in FIG. 1.

Figure 2B:
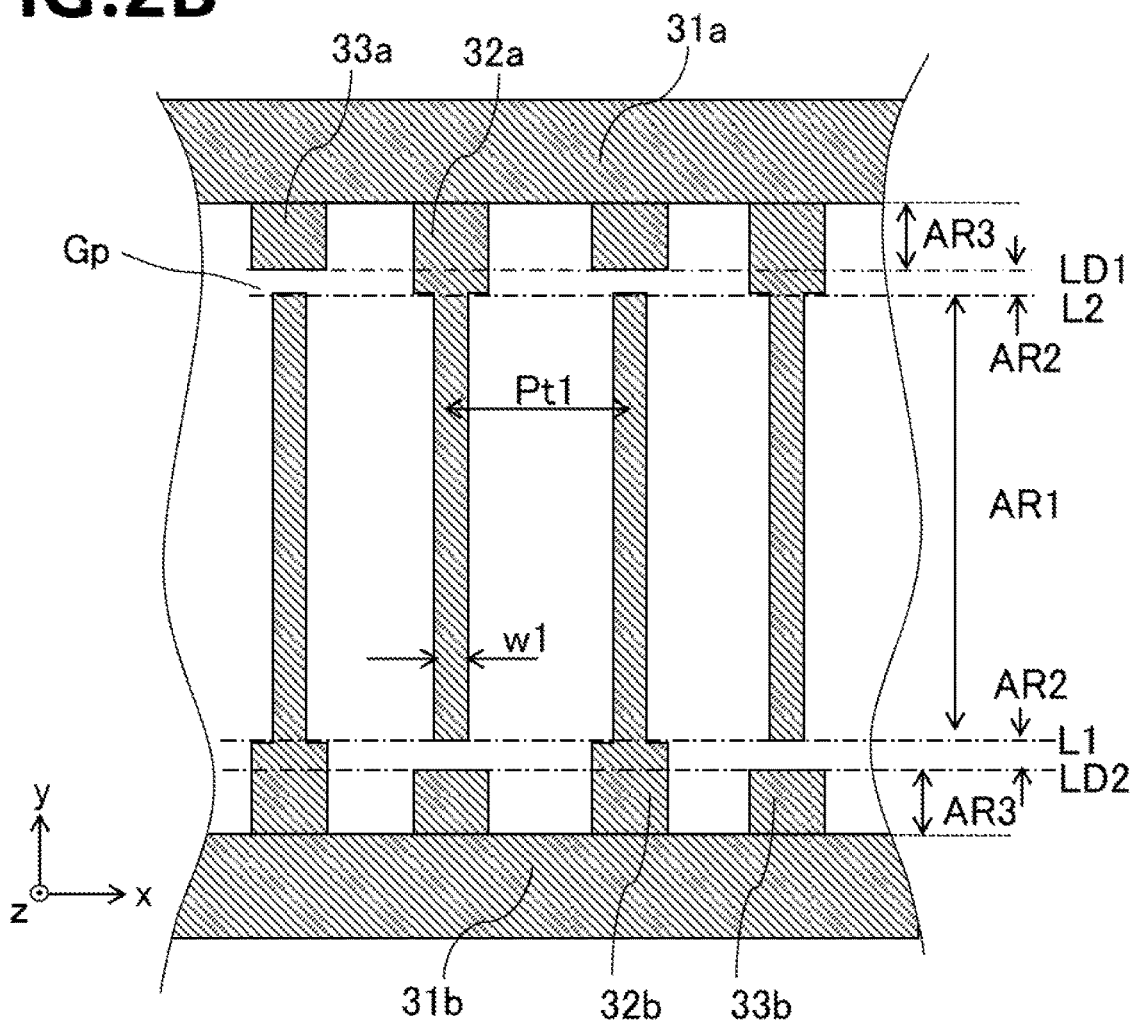
FIG. 2B is an enlarged view of the principal part in a region surrounded by a broken line in FIG. 1.

The SAW element 1, as shown in FIG. 1 and FIGS. 2A and 2B, has a substrate 2, an excitation electrode 3 (IDT electrode 3), and reflectors 4—all provided on an upper surface 2a of the substrate 2—and a support substrate 6 provided on a lower surface 2b of the substrate 2.

The substrate 2 is made of a material having a piezoelectric characteristic and is configured by a substrate of single crystal having a piezoelectric characteristic comprised of a lithium niobate ($LiNbO_3$) crystal or lithium tantalate ($LiTaO_3$) crystal. Specifically, for example, the substrate 2 is configured by a 36° to 48° Y-X cut $LiTaO_3$ substrate. The planar shape and various dimensions of the substrate 2 may be suitably set. As an example, the thickness (z-direction) of the substrate 2 is 1 μm to 30 μm.

The support substrate 6 is arranged on the lower surface 2b of the substrate 2. The support substrate 6 is for example formed by a material having a smaller thermal expansion coefficient than that of the material for the substrate 2. By employing such a configuration, due to the element substrate being configured by the substrate 2 and support substrate 6, thermal stress is generated in the substrate 2 when the temperature changes. At this time, the temperature dependency and the stress dependency of the elastic constant are cancelled out by each other and consequently the temperature change of the electrical characteristics of the SAW element 1 is compensated for. As such a material, for example, there can be mentioned sapphire or another single crystal, silicon or another semiconductor, an aluminum oxide sintered body or other ceramic, a quartz crystal, and so on. Note that, the support substrate 6 may be configured by stacking a plurality of layers which are made of materials different from each other.

The thickness of the support substrate 6 is for example constant. The thickness may be suitably set in the same way as the thickness of the substrate 2. However, the thickness of the support substrate 6 is set considering the thickness of the substrate 2 so that temperature compensation is suitably carried out. As an example, for a thickness of the substrate 2 of 5 to 30 μm, the thickness of the support substrate 6 is 75 to 300 μm.

The substrate 2 and the support substrate 6 are bonded to each other through a not shown bonding layer. The material of the bonding layer may be an organic material or inorganic material. As an organic material, for example there can be mentioned a thermosetting resin or other resin. As an inorganic material, for example there can be mentioned $SiO_2$. Further, the two substrates may be bonded by so-called direct bonding of activating the bonding surfaces by plasma, an ion gun, neutron gun, or the like, then bonding the bonding surfaces to each other without a bonding layer.

The IDT electrode 3, as shown in FIG. 1, has a first comb-shaped electrode 30a and second comb-shaped electrode 30b. Note that, in the following explanation, sometimes the first comb-shaped electrode 30a and the second comb-shaped electrode 30b will be simply referred to as the "comb-shaped electrodes 30" and the two will not be distinguished.

The comb-shaped electrodes 30, as shown in FIG. 1, have two bus bars 31 (first bus bar 31a, second bus bar 31b) facing each other and pluralities of electrode fingers 32 which extend from one bus bar 31 to the other bus bar 31 side. Further, the pair of comb-shaped electrodes 30 are arranged so that the first electrode fingers 32a and the second electrode fingers 32b intermesh (intersect) with each other in the direction of propagation of the acoustic wave.

Further, the comb-shaped electrodes 30 have dummy electrode fingers 33 respectively facing the electrode fingers 32 on the other side. The first dummy electrode fingers 33a extend from the first bus bar 31a toward the second electrode fingers 32b. The second dummy electrode fingers 33b extend from the second bus bar 31b toward the first electrode fingers 32a.

In more detail, the first bus bar 31a and the second bus bar 31b are arranged with a space from each other in the first direction (y-direction). The first bus bar 31a is connected to a first potential, and the second bus bar 31b is connected to a second potential, i.e., they are connected to different potentials. The first electrode fingers 32a are connected to the first bus bar 31a and extend from the first bus bar 31a toward the second bus bar 31b side. The second electrode fingers 32b are connected to the second bus bar 31b and extend from the second bus bar 31b toward the first bus bar 31a side. The first dummy electrode fingers 33a are connected to the first bus bar 31a and are arranged so as to face the tip ends of the second electrode fingers 32b through gaps. The second dummy electrode fingers 33b are connected to the second bus bar 31b and are arranged so as to face the tip ends of the first electrode fingers 32a through gaps.

The bus bars 31 are shaped straight in edge parts on the sides which face each other. In this example, the bus bars 31 are substantially formed in long shapes linearly extending with constant widths. The plurality of electrode fingers 32 are substantially formed in long shapes linearly extending with constant widths and are aligned at substantially constant intervals in the direction of propagation of the acoustic wave. Note that, the bus bars 31 also need not have constant widths. For example, they may have trapezoidal shapes having the edge parts of the bus bars 31 on the mutually facing sides as bottom sides.

The pluralities of electrode fingers 32 in the pair of comb-shaped electrodes 30 configuring the IDT electrode 3 are set so as to have a pitch Pt1. The pitch Pt1 is for example provided so as to become equal to a half wavelength of the wavelength λ of the acoustic wave at the frequency at which resonation is desired to be caused. The wavelength λ (2×Pt1) is for example 1.4 μm to 6 μm. In the IDT electrode 3, by arranging most of the plurality of electrode fingers 32 to have the pitch Pt1, the plurality of electrode fingers 32 are arranged by a constant period, therefore the acoustic wave can be efficiently generated.

Here, the "pitch Pt1", in the direction of propagation (x-direction), designates the interval from the center of a first electrode finger 32a to the center of a second electrode finger 32b which is adjacent to this first electrode finger 32a. Each electrode finger 32 is suitably set in width "w" in the direction of propagation of the acoustic wave in accordance with the electrical characteristics etc. which are demanded from the SAW element 1. The width w1 of the electrode fingers 32 is 0.3 to 0.7 time the pitch Pt1. Here, the "width w1" of the electrode fingers 32 designates the width in an intersection area AR1 in which the plurality of electrode fingers 32 intersect. In other words, when defining a first virtual line L1 connecting the tip ends of the first electrode fingers 32a and a second virtual line L2 connecting the tip ends of the second electrode fingers 32b, the intersection area AR1 becomes the region between these first virtual line L1 and second virtual line L2.

By arranging the electrode fingers 32 in this way, an acoustic wave propagating in the direction perpendicular to the plurality of electrode fingers 32 is generated. Accordingly, after considering the crystal orientation of the substrate 2, the two bus bars 31 are arranged so as to face each other in a direction crossing the direction in which the acoustic wave is desired to be propagated. The plurality of electrode fingers 32 are formed so as to extend in the direction perpendicular with respect to the direction in which the acoustic wave is to be propagated. Note that, the direction of propagation of the acoustic wave is defined according to the orientation etc. of the plurality of electrode fingers 32. However, in the present embodiment, for convenience, sometimes the orientation etc. of the plurality of electrode fingers 32 will be explained using the direction of propagation of the acoustic wave as the standard.

The numbers of the electrode fingers 32 (first electrode fingers 32a, second electrode fingers 32b) are 50 to 350 per side.

The lengths of the pluralities of electrode fingers 32 (lengths from the bus bars to the tip ends) are for example set to be substantially the same. The mutually intermeshing lengths (intersection widths) of the mutually facing electrode fingers 32 are 10 to 300 µm. Note that, it is also possible to change the lengths and intersection widths of the electrode fingers 32. For example, it is also possible to make them longer or shorter in the direction of propagation. Specifically, by changing the lengths of the electrode fingers 32 with respect to the direction of propagation, an apodized IDT electrode 3 may be configured. In this case, spurious emission of the lateral mode can be reduced, or the electric power resistance can be improved.

The IDT electrode 3 is for example configured by a metal conductive layer 15. As this metal, for example there can be mentioned Al or an alloy containing Al as a principal ingredient (Al alloy). The Al alloy is for example an Al—Cu alloy. Note that, the IDT electrode 3 may be configured by a plurality of metal layers as well. The various dimensions of the IDT electrode 3 are suitably set in accordance with the electrical characteristics etc. demanded from the SAW element 1. The thickness S (z-direction) of the IDT electrode 3 is for example 50 nm to 600 nm.

The IDT electrode 3 may be directly arranged on the upper surface 2a of the substrate 2 or may be arranged on the upper surface 2a of the substrate 2 through an underlying layer configured by another member. The other member is for example configured by Ti, Cr, or an alloy of them or the like. When the IDT electrode 3 is arranged on the upper surface 2a of the substrate 2 through the underlying layer, the thickness of the other member is set to extent so that almost no influence is exerted upon the electrical characteristics of the IDT electrode 3 (for example the thickness of 5% of the thickness S of the IDT electrode 3 in the case of Ti).

Further, on the electrode fingers 32 configuring the IDT electrode 3, a mass-addition film may be laminated in order to improve the temperature characteristic of the SAW element 1. As the mass-addition film, for example $SiO_2$ can be used.

The IDT electrode 3, when a voltage is applied, excites an acoustic wave propagating in the x-direction in the vicinity of the upper surface 2a of the substrate 2. The excited acoustic wave is reflected at boundaries between the electrode fingers 32 and regions where they are not arranged (long shaped regions each between the adjacent electrode fingers 32). Further, a standing wave having the pitch Pt1 of the electrode fingers 32 as a half wavelength is formed. The standing wave is converted to an electrical signal having the same frequency as that of the standing wave and is extracted by the electrode fingers 32. In this way, the SAW element 1 functions as a 1-port resonator.

The two reflectors 4 are arranged so as to sandwich the IDT electrode 3 in the direction of propagation of the acoustic wave. The reflectors 4 are substantially formed in slit shapes. That is, the reflectors 4 have reflector bus bars 41 which face each other in a direction crossing the direction of propagation of the acoustic wave and pluralities of reflection electrode fingers 42 which extend between these bus bars 41 in a direction perpendicular to the direction of propagation of the acoustic wave.

The pluralities of reflection electrode fingers 42 are arranged at a pitch Pt2 reflecting the acoustic wave excited in the IDT electrode 3. The pitch Pt2 may be set to the same extent as that of the pitch Pt1 when setting the pitch Pt1 in the IDT electrode 3 to a half wavelength of the wavelength λ of the acoustic wave. The wavelength λ (2×Pt2) is for example 1.4 µm to 6 µm. Here, the pitch Pt2, in the direction of propagation, designates the interval from the center of a reflection electrode finger 42 to the center of the reflection electrode finger 42 which is adjacent to it.

Each reflector 4 is arranged at an interval with respect to the IDT electrode 3. Here, the "interval" designates the interval from the center of the electrode finger 32 in the IDT electrode 3 which is positioned at the end part on the reflector 4 side to the center of the reflection electrode finger 42 in the reflector 4 which is positioned at the end part on the IDT electrode 32 side. This interval is usually set so as to become the same as the pitch Pt1 of the electrode fingers 32 in the IDT electrode 3.

The protective layer 5, as shown in FIG. 2, is provided on the substrate 2 so as to cover the tops of the IDT electrode 3 and reflectors 4. Specifically, the protective layer 5 covers the surfaces of the IDT electrode 3 and reflectors 4 and covers portions in the upper surface 2a of the substrate 2 which are exposed from the IDT electrode 3 and reflectors 4. The thickness of the protective layer 5 is for example 1 nm to 800 nm.

The protective layer 5 is made of a material having an insulation property and contributes to protection from corrosion etc. Preferably, the protective layer 5 is formed by $SiO_2$ or another material by which the propagation velocity of the acoustic wave becomes faster when the temperature rises. By this, it is also possible to keep a change of electrical characteristics due to a temperature change of the acoustic wave element 1 small.

Here, a configuration suppressing bulk wave spurious emission in the SAW element 1 and the mechanism thereof will be explained in detail.

It is considered that the strength and frequency of generation of the bulk wave spurious emission are influenced by the period of electrode fingers in the direction of propagation of the SAW (x-direction), thickness and material of the substrate 2, and so on.

Contrary to this, as a result of intensive and repeated trials by the inventors, the inventors found the fact that the bulk wave spurious emission depends also upon leakage of the acoustic wave in a direction (y-direction) crossing the direction of propagation of the SAW and made the strength thereof different.

Such leakage of the acoustic wave in the y-direction is mainly caused due to gaps Gp between the electrode fingers 32 and the dummy electrode fingers 33. A leakage wave generated in the gap Gp advances from the upper surface 2a of the substrate 2 to the support substrate 6 side in the thickness direction (z-direction) while radiating. That is, the closer to the support substrate 6 side in the thickness direction, the larger the width of the leakage wave when viewed on the xy plane, so the leakage wave expands to just below the electrode fingers 32 in the intersection area AR1 and just below the dummy electrode fingers 33. Such a leakage wave is reflected at the bonding interface with the support substrate 6 and reaches the electrode fingers 32 in the intersection area AR1 and dummy electrode fingers 33. When viewing the characteristics as a resonator, they appear as a spurious emission waveform on the characteristic waveform of impedance.

Here, in order to confirm the change of strength of bulk wave spurious emission when changing the quantity of the leakage waves in the gaps Gp, the sizes of gaps were changed and phase characteristics of the impedance were confirmed by simulation.

The finite element method was used for simulation. In this simulation, electrode fingers having an infinite periodic structure were computed. The impedance characteristic of one electrode finger 1 in that was computed.

Figure 3A:
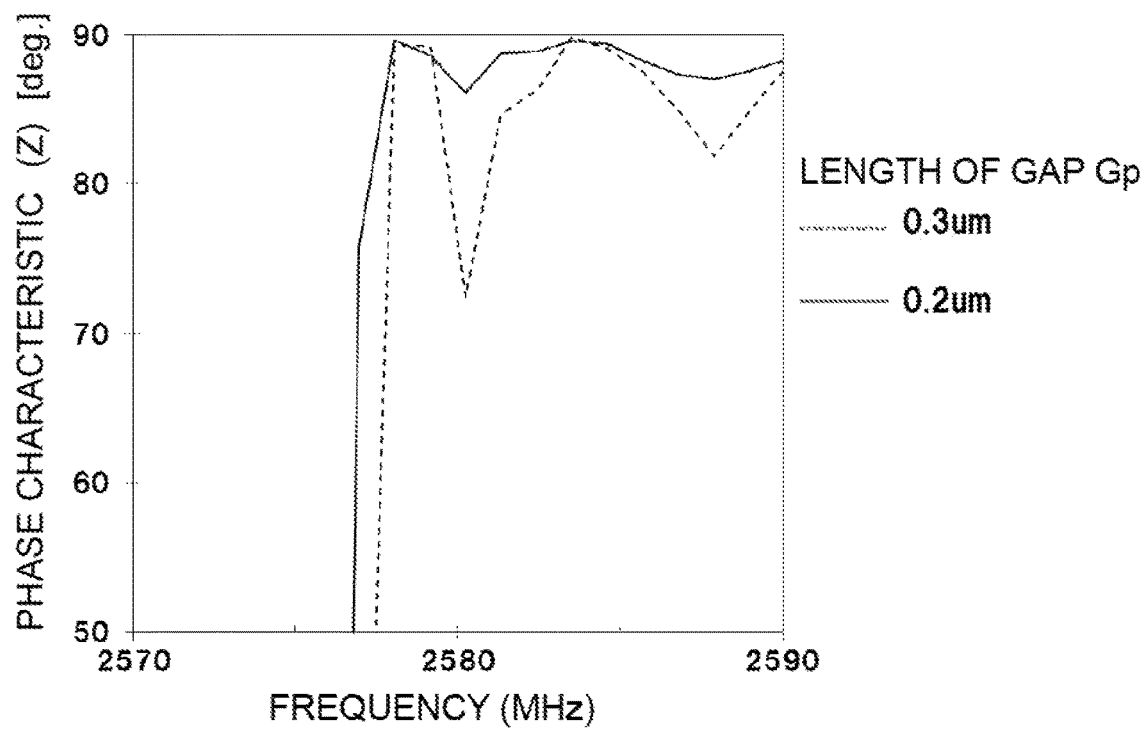

FIG. 3A shows the phase characteristics of the impedance in the vicinity of the resonance frequency when changing the quantity of the leakage waves in the gaps Gp. Specifically, in order to change the quantity of the leakage waves in the gaps Gp, simulation models given gaps which were made different were prepared, and the impedance characteristic in the vicinity of the resonance frequency was computed in each model. In FIG. 3A, a solid line shows the phase characteristic when setting the gaps of 0.2 μm, and a broken line indicates the phase characteristic when setting the gaps to 0.3 μm. As confirmed from this graph, the larger the gaps and the larger the leakage waves in the y-direction, the larger the strength of the bulk spurious emission. As seen also from this example, the strength of the bulk wave spurious emission depends upon the leakage waves in the gaps Gp. In other words, it was seen that the SAW element became sensitive in the phase characteristic with respect to the gaps Gp when using a bonded substrate.

Figure 3B:
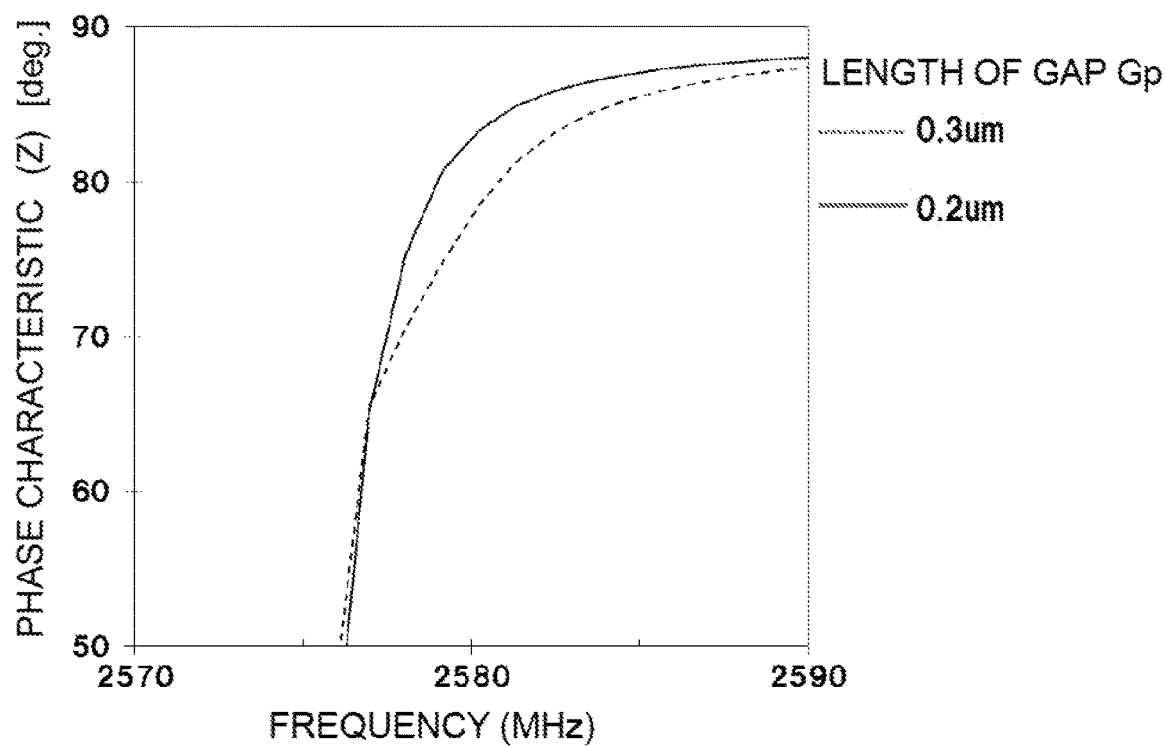
FIG. 3B is a graph showing the relationships between the gaps and the phase characteristic of the resonator when using a single substrate.

Note that, it is confirmed that when not a bonded substrate, but a substrate 2 which has a thickness large enough to independently function as the element substrate, the leakage waves (bulk waves) leaked in the thickness direction attenuate while advancing in the thickness direction and are reflected at the back face, so does not exert any influence upon the impedance characteristic (see FIG. 3B).

Here, it should be noted that while the loss becomes larger due to the change of the gaps Gp as shown in FIG. 3B when the substrate is not a bonded substrate, no drop in loss occurs as a whole and the spurious emission characteristic becomes conspicuous as shown in FIG. 3A when using a bonded substrate. From this as well, it is shown that the influence of the leakage wave exerted upon the characteristics as a resonator and its mechanism are different between a bonded substrate and a usual thick substrate made of a single material.

Note that, in the simulation in FIGS. 3A and 3B, the widths of the electrode fingers and dummy electrode fingers are made constant.

In the SAW element 1 in the present embodiment, the widths (widths in the x-direction) of the electrode fingers 32 in the IDT electrode 3 are different between the inside and the outside of the intersection area AR1. Specifically, in the first electrode fingers 32a, the width in a part from the first bus bar 31a to the second virtual line L2 becomes larger than the width in apart from the second virtual line L2 to the second bus bar 31b side (intersection area AR1). In the same way, in the second electrode fingers 32b, the width in a part from the second bus bar 31b to the first virtual line L1 becomes larger than the width in a part from the first virtual line L1 to the first bus bar 31a side (intersection area AR1).

In this way, by the widths of the electrode fingers 32 being larger in the region which is outside of the intersection area AR1 and where the dummy electrode fingers 33 are formed, the region of the gap which becomes the cause of leakage of the acoustic wave can be effectively made small. As a result, the leakage of the acoustic wave to the dummy electrode finger 33 side in the upper surface of the substrate 2, or to the internal portion of the substrate 2 (z-direction) can be suppressed.

Further, when focusing on the second electrode fingers 32b, as shown in FIG. 2B, the second electrode fingers 32b are given electrode finger widths made larger than those in the intersection area AR1 even in the region where the gaps Gp are formed between adjacent first electrode fingers 32a and dummy electrode fingers 33b which face the tip ends of them. In other words, even in a region (gap area AR2) sandwiched between a virtual line LD2 connecting the tip ends of the second dummy electrode fingers 33b and L1, the second electrode fingers 32b become larger in electrode finger widths than in the intersection area AR1.

In this way, by making the widths of the second electrode fingers 32b larger also in the gap area AR2, it is possible to provide a SAW element 1 suppressing the leakage of the acoustic wave between the electrode fingers 32 and the second dummy electrode fingers 33b. Specifically, this structure performs the role of an intermediate structure smoothly connecting the intersection area AR1 and a dummy area AR3 between which the widths of the electrode fingers 32 are different, therefore the leakage of the acoustic wave can be effectively suppressed. Further, in the direction of propagation of the acoustic wave, the gap area AR2 become a discontinuous part in the electrode fingers. However, by making the widths of the electrode fingers larger in this area than those in the intersection area AR1, leakage of the acoustic wave can be prevented.

Note that, there are two each gap areas AR2 and dummy areas AR3 straddling the intersection area AR1. Therefore, sometimes the term "first" will be attached to the areas closer to the first bus bar 31a than the intersection area AR1, and the term "second" will be attached to the areas closer to the second bus bar 31b than the intersection area AR1.

Here, in the entire region outside the intersection area AR1, the electrode fingers 32 become broader in electrode finger widths than in the intersection area AR1. Specifically, they may be given electrode finger widths which are 105% to 160% of the electrode finger widths in the intersection area AR1.

When giving the first electrode fingers 32a the same electrode finger width as well as in this example, it is possible to provide a SAW element 1 suppressing leakage of the acoustic wave between the electrode fingers and the first dummy electrode fingers 33a and reducing the bulk wave spurious emission.

Further, a case where a conductive layer 15 is formed on the upper surface 2a of the substrate 2 and where the pluralities of electrode fingers 32 and dummy electrode fingers 33 are formed to desired patterns by using a mask will be studied. In this case, if the amount of light transmission through the mask due to the mask pattern is large, the conductive layer 15 ends up being patterned to shapes inside the desired patterns. Contrary to this, according to the SAW element 1, the electrode finger widths of the electrode fingers 32 connected to one potential is made larger in the region between the virtual line connecting the tip ends of the neighboring electrode fingers 32 which are connected to another potential and the virtual line connecting the tip ends of the dummy electrode fingers 33 which are connected to the above one potential. According to such a configuration, the amount of light transmission of the mask in the vicinities of the gaps Gp can be suppressed. As a result, it is possible to suppress a retraction of the tip ends of the neighboring other electrode fingers 32 and the tip ends of the dummy electrode fingers 33 which face them and are connected to the above one potential to the side inside the mask pattern (desired pattern). In this case, expansion of the gaps Gp to more than the desired value can be suppressed, therefore leakage of the acoustic waves from the gaps Gp can be suppressed.

The phenomenon of the gaps Gp expanding to over the desired value due to patterning from the mask pattern becomes conspicuous in a case where the light diffraction angle of the mask becomes larger due to the electrode fingers being made thinner and consequently the amount of light transmission becoming larger. Specifically, it becomes conspicuous when the acoustic wave excited by the IDT electrode 3 exceeds 2.4 GHz. In order to excite an acoustic wave having such frequency, the electrode finger pitch becomes 0.82 μm or less.

Further, according to the SAW element 1 in the present embodiment, the electrode fingers 32 do not have projecting parts when viewed from the bus bar 31 side where they are connected. In other words, the electrode fingers 32 become the broadest at the positions where they are connected to the bus bar 31.

As explained above, the case where the electrode fingers 32 are formed in the SAW element 1 with a very narrow pitch is assumed. In this case, the electrode fingers 32 do not have projecting parts projecting to the x-direction, therefore short-circuiting by unintended contact with electrode fingers 32 connected to another potential can be suppressed. With respect to this, according to the SAW element 1, short-circuiting with the electrode fingers 32 connected to different potentials can be suppressed while suppressing leakage of the acoustic wave in the vicinities of the gaps Gp.

Further, according to the SAW element 1 in the present embodiment, the electrode finger widths of the dummy electrode fingers 33 become larger than the electrode finger widths in the intersection area AR1 of the electrode fingers 32. In this case, the leakage of the acoustic wave can be suppressed, the amount of light transmission of the mask making the light diffraction angle larger is suppressed when forming the dummy electrode fingers 33 from the conductive layer 15, and the expansion of the gaps Gp can be suppressed. Note that, in the entire region, the dummy electrode fingers 33 become broader than the widths of the electrode fingers 32 on the side inside the intersection area. Specifically, their electrode finger widths may be set to 105% to 160% relative to the electrode finger widths in the intersection area AR1.

In this way, in the SAW element 1 using a bonded substrate, by making the widths of the electrode fingers 32 and dummy electrode fingers 33 outside of the intersection area larger, the leakage waves can be suppressed even in the gaps Gp having the same sizes. Further, according to such a configuration, even when the resonance frequency is high, reduction of the sizes of the gaps Gp themselves is enabled. In particular, by both of the electrode fingers 32 and dummy electrode fingers 33 becoming broader in the entire region from the roots on the bus bar 31 side to the intersection area AR1 than the electrode finger widths in the intersection area AR1, the amount of transmission of light to the vicinities of the gaps at the time of exposure is suppressed, therefore expansion of the gaps can be suppressed. From the above description, according to the SAW element 1, it is possible to provide an acoustic wave element suppressing bulk wave spurious emission.

Note that, in the embodiment explained above, the IDT electrode 3 included only the first and second electrode fingers 32a and 32b and the first and second dummy electrode fingers 33a and 33b having widened portions which became larger in widths than the widths of the electrode fingers 32 in the intersection area AR1, but the present invention is not limited to this example. For example, it may include the electrode fingers and dummy electrode fingers having the same line widths as those in the intersection area AR1 over their entirety. In this case, preferably they are located on the sides closer to the reflectors 4 than the center in the IDT electrode 3.

<Modification 1 of SAW Element>

Figure 4:
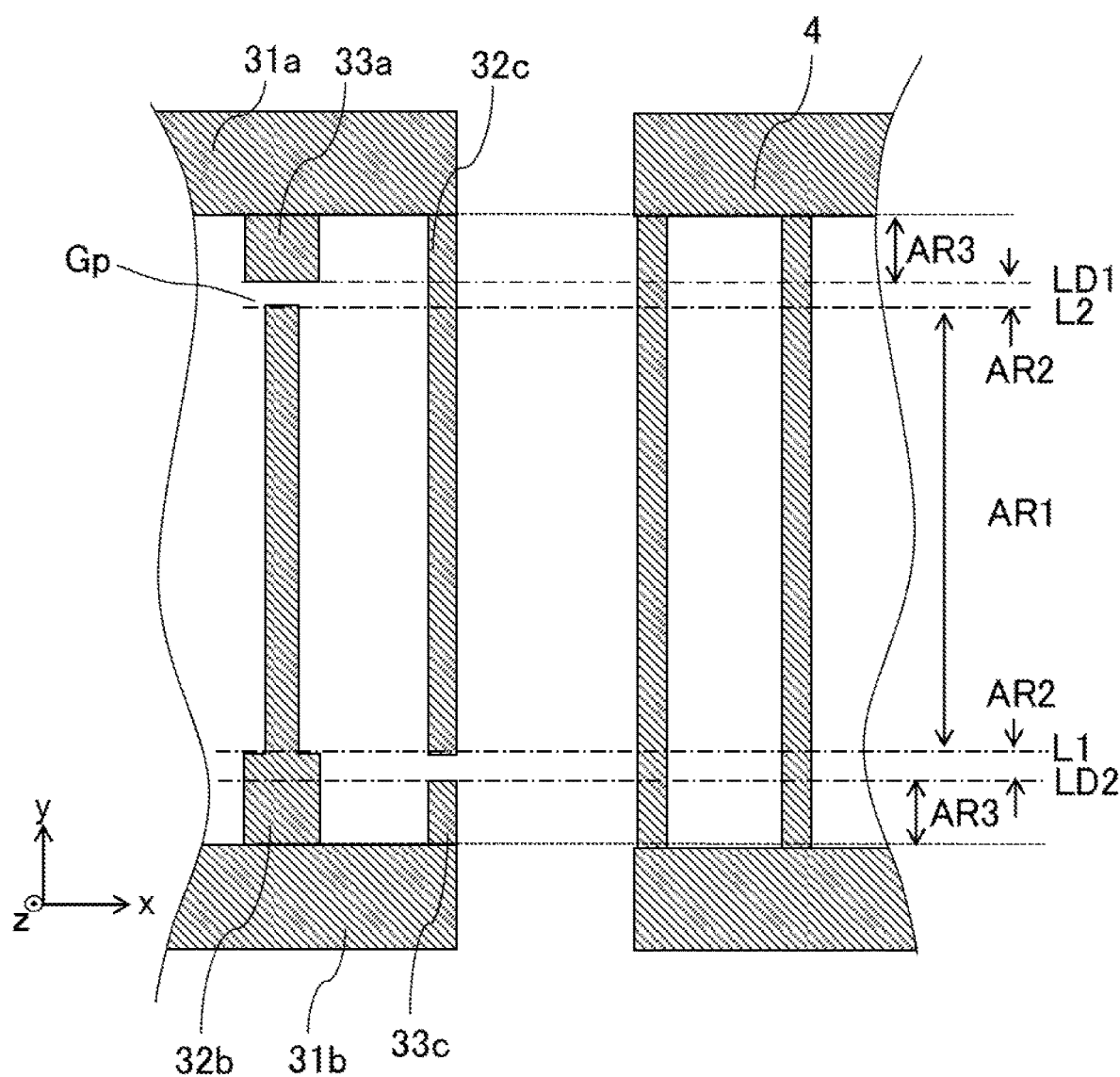
FIG. 4 A plan view showing a modification of a SAW element in FIG. 1.

FIG. 4 shows an enlarged plan view of the principal part in a SAW element 1A according to a modification of the SAW element 1. FIG. 4 is an enlarged view of the principal part corresponding to a region surrounded by a dotted line in FIG. 1.

The SAW element 1A differs from the SAW element 1 in the point that the IDT electrode 3 is provided with third electrode finger 32c and third dummy electrode finger 33c. Hereinafter, only different portions will be explained, and overlapping explanations of the same configurations will be omitted.

In the SAW element 1A, the third electrode finger 32c is the electrode finger which is closest to the reflector 4 among the plurality of electrode fingers in the IDT electrode 3, while the third dummy electrode finger 33c is connected to a potential different from that for the third electrode finger 32c and is arranged so as to face the tip end of the third electrode finger 32c. In more detail, in this example, the third electrode finger 32c is connected to the first bus bar 31a, and the third dummy electrode finger 33c is connected to the second bus bar 31b. Note that, the third electrode finger 32c is connected to a potential different from that for the adjacent electrode finger 32.

Here, at least one of the third electrode finger 32c and third dummy electrode finger 33c become narrower in electrode finger widths on the outside of the intersection area AR1 than the electrode finger widths of the first electrode fingers 32a and second electrode fingers 32b on the outside of the intersection area AR1. Such electrode finger widths, for example, may be made equal to the electrode finger widths in the intersection area AR1.

When the electrode finger widths of the third electrode finger 32c and/or third dummy electrode finger 33c are large, if the reflector 4 is grounded, the space between the third dummy electrode finger 33c and the reflector 4 is apt to become the starting point of electrostatic breakdown, therefore the ESD resistance is liable to deteriorate. Contrary to this, according to the SAW element 1A, a sufficient distance can be provided even between the finger and the reflector 4, therefore the resultant ESD resistance becomes excellent.

Further, at the time of patterning of the conductive layer 15, sometimes the electrode fingers 32c and 33c in the IDT electrode 3 which are the closest to the reflector 4 become broader patterns compared with the vicinity of the central part of the IDT electrode 3 in which the electrode fingers 32a and 32b are alternately arranged. The reason for this can be considered as follows: Usually there are no patterns in the vicinity of the reflectors 4, therefore, with respect to the electrode fingers 32c and 33c, the amount of light diffraction from the mask patterns of the adjacent electrode fingers 32 and 33 and reflectors 4 becomes small and consequently the line widths become broader compared with that in the vicinity of the central part of the IDT electrode 3 in which the electrode fingers 32a and 32b having a large amount of light diffraction are alternately arranged. In such case, a sufficient gap Gp cannot be formed, therefore short-circuiting between the electrode finger and the dummy electrode finger is liable to occur. Contrary to this, according to the SAW element 1, provision is made of the third electrode finger 32c and third dummy electrode finger 33c, therefore the amount of light transmission of the mask is increased, and the gap Gp can be reliably formed.

Note that, in this way, even in a case where the electrode finger widths are made constant on the sides closest to the reflectors 4 in the IDT electrode 3, usually the distribution of amplitude of the acoustic wave in the IDT electrode 3 becomes smaller the closer to the reflectors 4, therefore the influence upon the emission loss of the acoustic wave is small, so there is no problem.

<Modification 2 of SAW Element>

Figure 5:
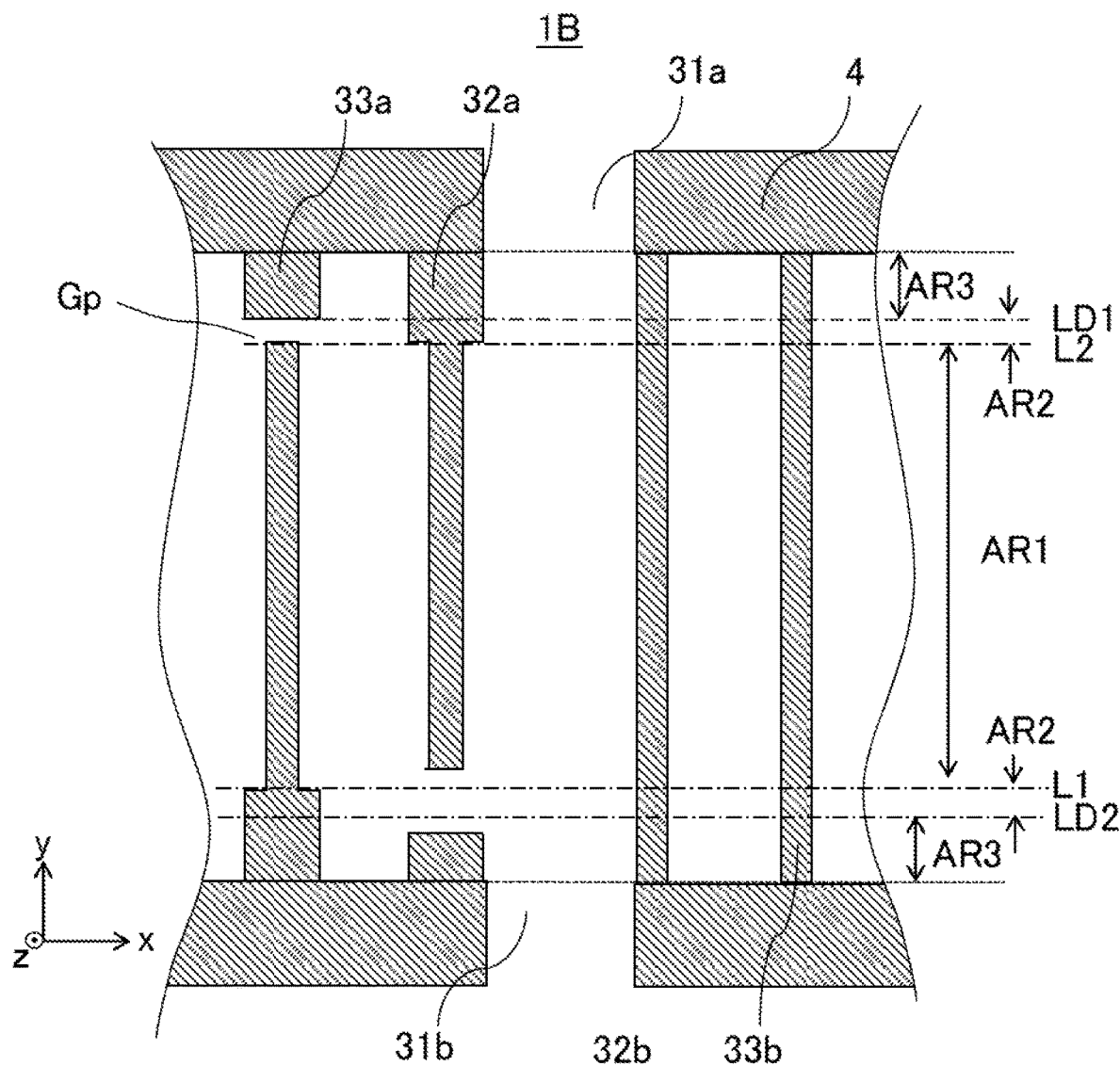
FIG. 5 A plan view showing a modification of a SAW element in FIG. 1.

FIG. 5 shows an enlarged plan view of the principal part of a SAW element 1B according to a modification of the SAW element 1. FIG. 5 is an enlarged view of the principal part corresponding to the region surrounded by the dotted line in FIG. 1.

In the SAW element 1B, the size of the gap Gp between the electrode finger and dummy electrode finger in the IDT electrode 3 which are closest to the reflector 4 differs from that in the SAW element 1. Below, only different portions will be explained, and overlapping explanations of the same configurations will be omitted.

The SAW element 1B focuses on the combination of the first electrode finger 32a as the electrode finger closest to the reflector 4 among the pluralities of electrode fingers in the IDT electrode 3 and the second dummy electrode finger 33b which is arranged so as to face the tip end of the above first electrode finger 32a. In the SAW element 1B, the size R1 of the gap Gp of this combination of electrode fingers is made larger compared with the sizes R2 of the other gaps Gp. As such a gap Gp, R1 may be made 1.5 times R2.

At the time of patterning of the conductive layer 15, the electrode fingers closest to the reflectors 4 in the IDT electrode 3 tend to become broad and long patterns. In this case, a sufficient gaps Gp cannot be formed, so short-circuiting is liable to occur between the electrode fingers and the dummy electrode fingers. Contrary to this, according to the SAW element 1B, the gaps between the electrode fingers in the IDT electrode 3 which are closest to the reflectors 4 and the dummy electrode fingers which face them are made large, therefore it is possible to increase the amount of light transmission of the mask and reliably form the gaps Gp.

Note that, in this way, even in a case where the gaps are made large on the sides closest to the reflectors 4 in the IDT electrode 3, usually the distribution of amplitude of the acoustic wave in the IDT electrode 3 becomes smaller the closer to the reflectors 4, therefore the influence upon the emission loss of the acoustic wave is small, so there is no problem.

<Acoustic Wave Device>

Figure 6:
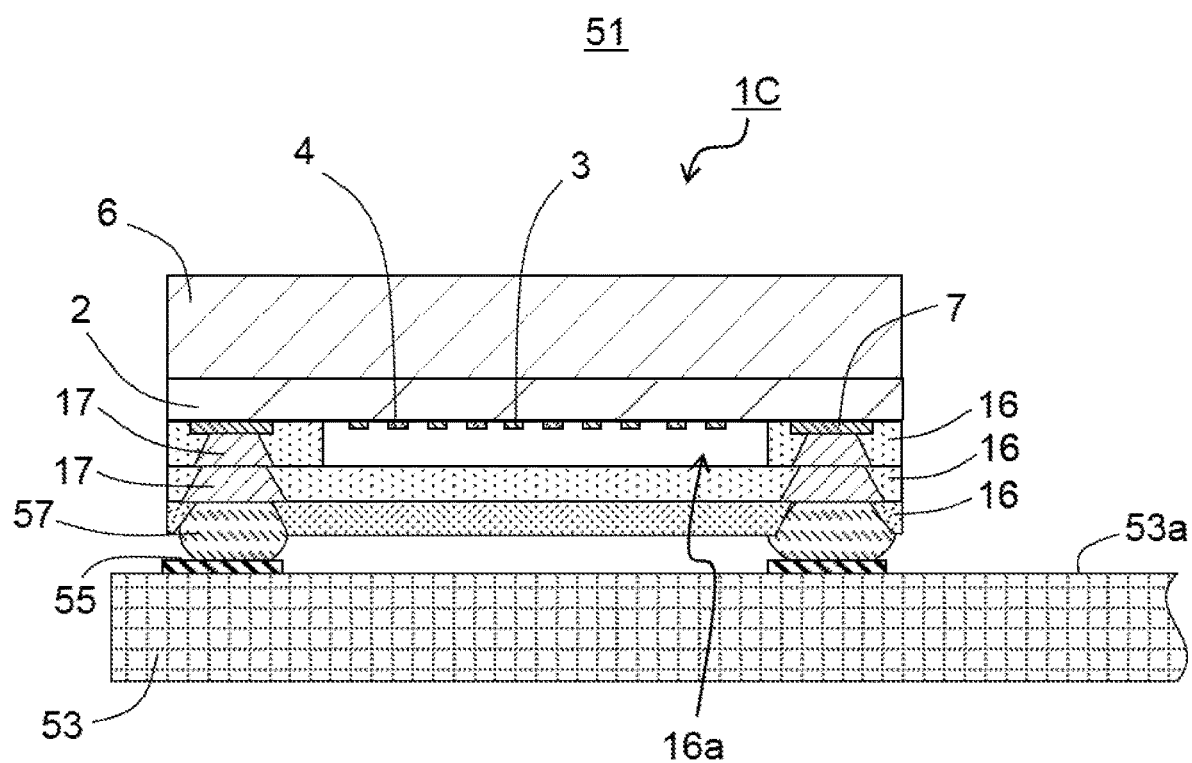
FIG. 6 A schematic cross-sectional view of an acoustic wave device of the present invention.

FIG. 6 is a cross-sectional view of an acoustic wave device 51 (referred to as the SAW device 51 in the present example) to which the SAW element 1 explained above is applied The SAW device 51 configures for example a filter or duplexer and functions as a communication device together with an antenna terminal. The SAW device 51 has a SAW element 1C and a circuit board 53 on which the SAW element 1C is mounted.

The SAW element 1C is for example configured as a SAW element of a so-called wafer level package. The SAW element 1C is provided with a cover 16 covering the SAW element 1 explained above and the SAW element 1 side of the substrate 2 and terminals 17 which are electrically connected to the IDT electrode 3 and are led out to the outside of the cover 16. Note that, the terminals 17 are provided on pads 7 which are electrically connected to the IDT electrode 3.

The cover 16 is configured by a resin or the like and forms a vibration space 16a above the IDT electrode 3 and reflectors 4 for facilitating the propagation of the SAW.

The circuit board 53 is configured by for example a so-called rigid type printed wiring board. Mounting pads 55 are formed on a mounting surface 53a of the circuit board 53.

The SAW element 1C is arranged with the cover 16 side facing the mounting surface 53a. Further, the terminals 17 and the mounting pads 55 are bonded by a solder 57. After that, the SAW element 1C is sealed by a sealing resin 50.

In this way, the SAW device 51 including the SAW element 1C and circuit board 53 can be obtained.

This SAW device 51 uses the SAW element 1C suppressed in insertion loss and other loss, therefore high speech quality can be obtained.

Note that, the SAW element and SAW device explained above show one embodiment and can be variously changed within the scope of the gist of the present invention. For example, the shapes of the electrode fingers 32 may be changed as well. FIG. 7 shows a variation of the shapes taking as an example the second electrode fingers 32b.

Figure 7A:
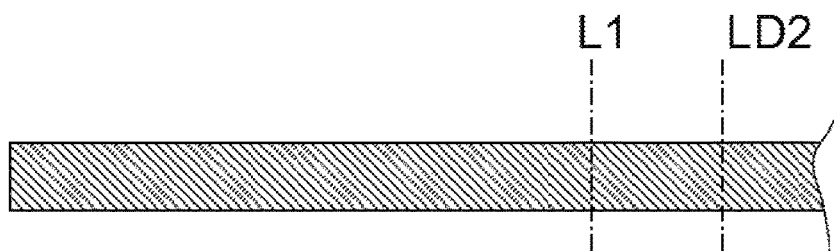

For example, in the present invention, the widths may be increased in at least one of the electrode fingers 32 and 33 which are positioned in a region other than the intersection area AR1. Therefore so far as the dummy electrode fingers 33 are widened, the electrode fingers 32 may have constant electrode finger widths in the y-direction (first direction) as shown in FIG. 7A and those widths may be equal to those in the intersection area AR1.

Figure 7B:
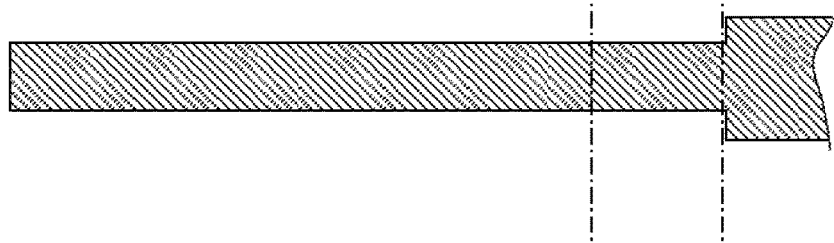
Figure 7C:
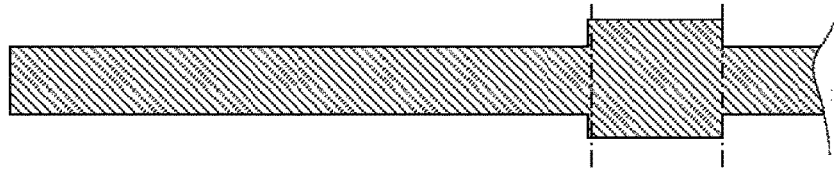
Figure 7D:
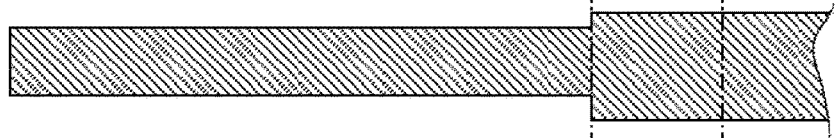

Further, as shown in FIG. 7B, the electrode finger widths may be constant in the intersection area AR1 and gap areas AR2 and may be widened in the dummy areas AR3. Further, as shown in FIG. 7C, the width may be constant in the intersection area AR1 and dummy areas AR3 and may be widened in the gap areas AR2. As shown in FIG. 7D, the electrode fingers may have constant widths in the gap areas AR2 and dummy areas AR3. Those widths may be larger compared with those in the intersection area AR1.

Figure 7E:

Further, as shown in FIG. 7E, both of the electrode finger widths in the gap areas AR2 and in the dummy areas AR3 may be broader than the electrode finger widths in the intersection area AR1, and the electrode finger widths may be smaller in the gap areas AR2 compared with those in the dummy areas AR3. In this case, the line widths in the gap areas AR2 continuously change up to the line width in the intersection area AR1, therefore are optimum as an intermediate structure, so mismatches between the inside and the outsides of the intersection area AR1 can be suppressed.

EXAMPLES

Simulation models were prepared by setting, in the non-intersection areas (gap areas AR2 and dummy areas Ar3), various shapes and dimensions of the electrode fingers 32 and dummy electrode fingers 33 configuring the IDT electrode 3. Further, the propagation loss of the SAW was evaluated according to the simulation. The finite element method was used for the simulation. In the simulation, electrode fingers having an infinite periodic structure were computed, and the impedance characteristic of one of the electrode fingers was computed.

First, simulation models of Comparative Example 1 and Examples 1 and 2 with different shapes of the electrode fingers 32 were prepared.

Conditions Common to Comparative Example 1 and Examples 1 and 2

Pitch Pt1 of electrode fingers 32: 0.77 μm (resonance frequency: about 2.58 GHz)

Electrode finger width of electrode fingers 32 in intersection area AR1: 0.385 μm Length of gaps Gp: 0.2 μm
Thickness (z-direction) of electrode fingers: 123 nm
Material of substrate 2: 42° Y-X cut LiTaO₃
Thickness of substrate 2: 7 μm
Material of support substrate 6: Silicon
Thickness of support substrate 6: 230 μm In Comparative Example 1, as shown in FIG. 7A, the electrode finger widths (electrode fingers 32, dummy electrode fingers 33) are constant from the intersection area AR1 to the dummy areas AR3. In Example 1, as shown in FIG. 7B, the electrode finger widths are constant in the intersection area AR1 and gap areas AR2, and the electrode finger widths are widened in the dummy areas AR3 (width: 0.539 um). In Example 2, as shown in FIG. 7D, the electrode finger widths are constant in the intersection area AR1, and the electrode finger widths are widened in the gap areas AR2 and dummy areas AR3 (width: 0.539 um). Note that, in any case, the dummy electrode fingers 33 are given widths made equal to the widths of the electrode fingers 32 in the dummy areas AR3.

Figure 8A:
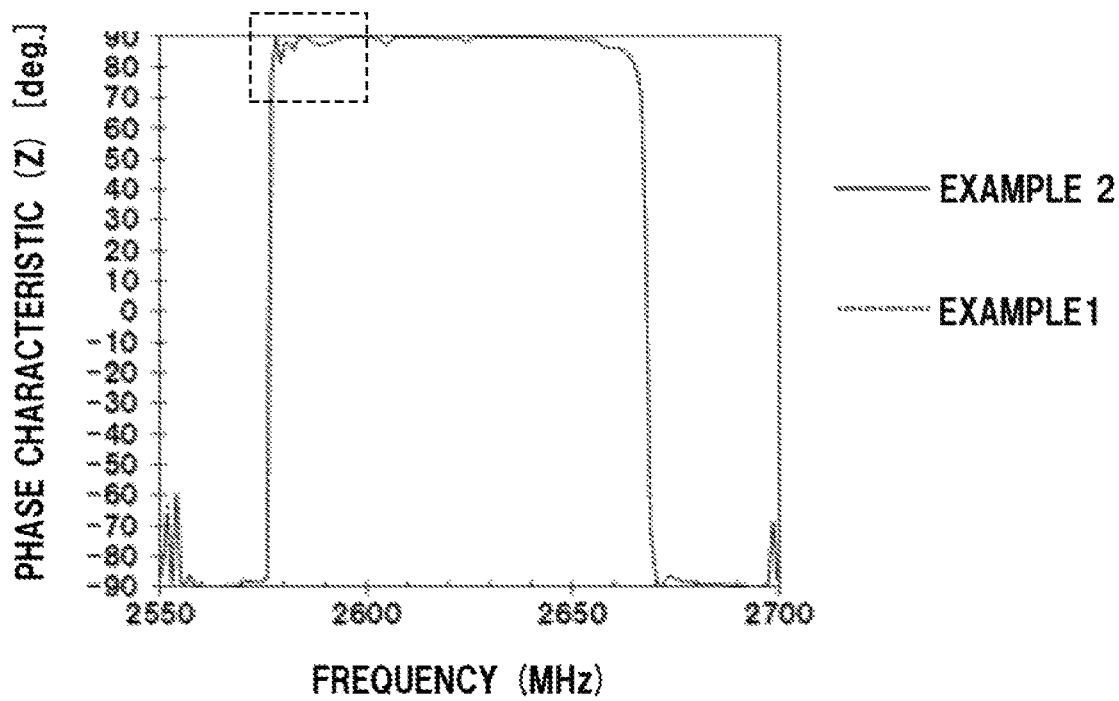
FIG. 8 Graphs showing the frequency characteristics of SAW elements according to examples and a comparative example.
Figure 8B:
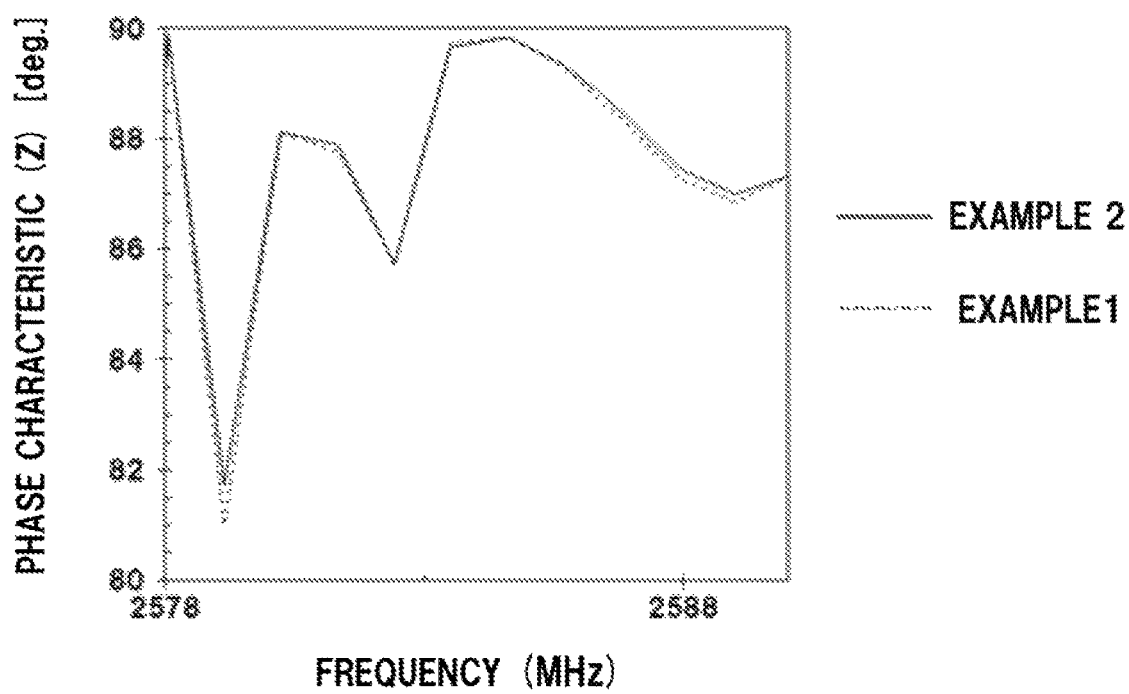

A comparison of the phase characteristics in Examples 1 and 2 will be shown in FIGS. 8A and 8B. In FIG. 8A, the abscissa indicates the frequency "f" (MHz), and the ordinate indicates the phase characteristic of an impedance Z (deg.: indicated by "°" in the sentences). The frequency at 0° when the phase characteristic changes from the −90° to the +90° side is the resonance frequency. Further, the frequency at 0° when the phase characteristic changes from the +90° to the −90° side is the anti-resonance frequency. The phase characteristic can be used as an index of the loss in the resonator. As shown in the graph, the loss is smaller when the phase is closer to −90° in the frequency range lower than the resonance frequency and frequency range higher than the anti-resonance frequency, while the loss is smaller when the phase is closer to +90° in the frequency range between the resonance frequency and the anti-resonance frequency.

FIG. 8B is an enlargement of the region surrounded by the broken line in FIG. 8A. In FIGS. 8A and 8B, the solid lines indicate the phase characteristic in Example 1, and the dotted lines indicate the phase characteristic in Example 2.

Relative to Comparative Example 1, the SAW elements in Examples 1 and 2 were not much different in the overall phase characteristics. Further, it was seen that a bulk wave spurious emission manifested in a frequency range a bit higher than the resonance frequency was reduced due to the shape of electrode fingers in the examples. That is, it was seen from FIGS. 8A and 8B that this bulk wave spurious emission was further reduced at the time when the electrode finger width was widened not only in the dummy area AR3 (Example 1), but also in the gap areas AR2 (Example 2).

Note that, in the simulation explained above, the computation was carried out by using an extremely narrow gap having a numerical value of 0.2 μm. This value is a numerical value which corresponds to approximately 0.12λ in the examples explained above and is a little difficult to realize. The actually found gap having 0.15λ to 0.2λ becomes 0.23 to 0.3 μm. Referring to FIG. 3, the influence by the bulk wave spurious emission becomes further larger. For this reason, it is desired to devise the electrode fingers as shown in Examples 1 and 2.

Further, in the case of such a fine line width and gap, there is the tendency that the actual electrode finger shapes will retract from the dimensions of the mask and the gap will increase in the finished state. It was confirmed also from this point that the increase of the gap was suppressed by devising the electrode fingers as in Examples 1 and 2, the bulk wave spurious emission from the first was prevented from being larger while further suppressing the bulk wave spurious emission due to the shape of the electrode fingers, and thus a higher precision SAW element could be provided.

OTHER EXAMPLES

Next, other effects of the present invention with respect to the SAW element 1 will be explained. The SAW elements 1 in Comparative Example 2 and Example 3 were actually prepared, and the phase characteristics of the impedance were measured.

Conditions Common to Comparative Example 2 and Example 3

Pitch Pt1 of electrode fingers 32: 0.791 μm (resonance frequency: about 2.467 GHz)

Electrode finger width of electrode fingers 32 in intersection area AR1: 0.447 μm Thickness (z-direction) of electrode fingers: 123 nm
Width of intersection area AR1: 38 μm
Length of gaps Gp on mask: 0.20 μm
Number of electrode fingers 32: 230 (115 pairs)
Material of substrate 2: 46° Y-X cut LiTaO₃
Thickness of substrate 2: 10 μm
Material of support substrate 6: Silicon
Thickness of support substrate 6: 230 μm In Comparative Example 2, as shown in FIG. 7A, the electrode finger widths (electrode fingers 32, dummy electrode fingers 33) are constant in the y-direction (first direction), and the widths are equal to those in the intersection area AR1. In Example 3, as shown in FIG. 7B, the electrode finger widths are constant in the intersection area AR1 and gap areas AR2, and the electrode finger widths are widened in the dummy areas AR3 (width: 0.512 um).

In Comparative Example 2, even when the lengths of the gaps Gp on the mask were set to 0.20 μm, the lengths of the gaps Gp in the finished state of the prepared SAW element were expanded to 0.28 μm. On the other hand, in Example 3, when the lengths of the gaps Gp on the mask were set to 0.20 μm, the lengths of the gaps Gp in the finished state became 0.21 μm. They represent almost no expansion relative to the gaps Gp on the mask and are smaller than the lengths of the gaps Gp in Comparative Example 2. In this way, it could be confirmed that a phenomenon such as expansion of the gaps Gp exceeding the desired value due to patterning from the mask pattern became conspicuous in the case where the frequency of the acoustic wave excited by the IDT electrode 3 exceeded 2.4 GHz.

Figure 9A:
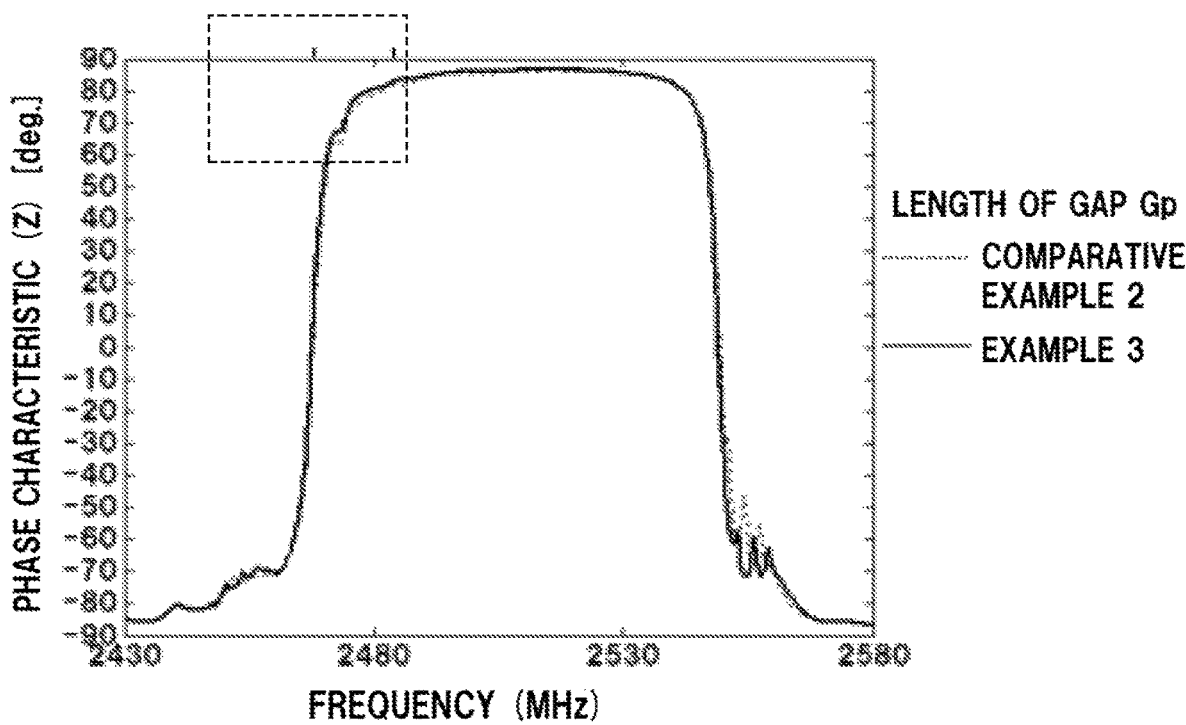
FIG. 9 Graphs showing the frequency characteristics of SAW elements according to an example and a comparative example.
Figure 9B:
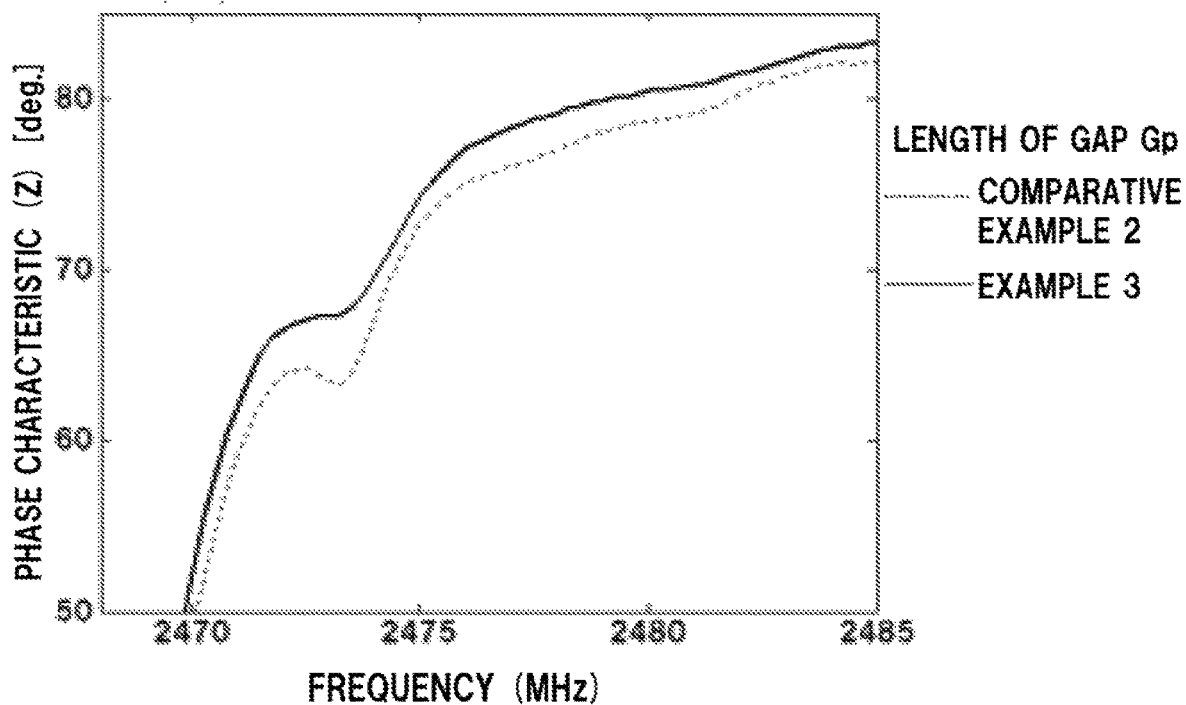

Such a comparison of phase characteristics between Comparative Example 2 and Example 3 will be shown in FIGS. 9A and 9B. In FIG. 9A, the abscissa shows the frequency, and the ordinate shows the phase characteristic of the impedance. FIG. 9B is a graph enlarging the region surrounded by the broken line in FIG. 9A. As shown in these graphs, it can be confirmed that the bulk wave spurious emission is suppressed and also the loss is suppressed in Example 3 compared with Comparative Example 2. From the above description, it was confirmed that Example 3 enjoyed both the effects of a reduction of the propagation loss of SAW due to the expansion of the gaps Gp caused when preparing the SAW element exceeding 2.4 GHz, and a reduction of the bulk wave spurious emission caused by the gap areas AR2.

OTHER EXAMPLES

Next, other effects of the present invention with respect to the SAW element 1 will be explained. The SAW elements 1 in Comparative Examples 3 to 5 and Example 4 were prepared and the phase characteristics of impedance were measured.

Conditions Common to Comparative Examples and Example

Pitch Pt1 of electrode fingers 32: 0.77 μm (resonance frequency: about 2.53 GHz)
Electrode finger width of electrode fingers 32 in intersection area AR1: 0.39 μm
  Thickness (z-direction) of electrode fingers: 121 nm
  Width of intersection area AR1: 31 μm
  Number of electrode fingers 32: 300 (150 pairs)
  Material of substrate 2: 42° Y-X cut LiTaO₃
  Thickness of substrate 2: 7 μm
  Material of support substrate 6: Silicon
  Thickness of support substrate 6: 230 μm
In Comparative Examples 3 to 5, as shown in FIG. 7A, the electrode finger widths (electrode fingers 32, dummy electrode fingers 33) are constant in the y-direction (first direction) and the widths are equal to those in the intersection area AR1. In Example 4, as shown in FIG. 7D, the duty of the mask was set to 0.63 so that the electrode finger widths of the electrode fingers 32 and 33 positioned in the non-intersection area would be widened.

Further, in Comparative Examples 3 to 5, the sizes of the gaps Gp on the mask were set to 0.15 μm, 0.2 μm, and 0.25 μm in that order. In Example 4, the size of the gap Gp on the mask was set to 0.2 μm.

When the SAW elements according to the comparative examples were prepared by using such a mask, the electrode finger 32 and the dummy electrode finger 33 short-circuited in the gap area AR2 in Comparative Example 3, therefore the resonator could not be prepared. In Comparative Examples 4 and 5, short-circuiting was not caused, but the sizes of the gaps in the finished state became 0.356 μm and 0.431 μm, so the gaps expanded. As a result of comparison with the result in Comparative Example 2, it could be confirmed that the ratio of the expansion relative to the mask dimension became more conspicuous as the frequency became higher (the line width of the electrode finger 32 became thinner). Note that, the duty in Comparative Examples 3 to 5 was set to 0.43 on the mask, but the duty in the finished state was 0.507.

Contrary to this, in Example 4, the size of the gap in the finished state was 0.219 μm, so it was confirmed that the expansion of the gaps could be sufficiently suppressed relative to the comparative examples. Further, as confirmed, when the frequency became high, the sizes of the gaps in an the finished state could not be controlled with the gap dimensions on the mask, and a SAW element having desired gaps could be manufactured first by widening the widths of the electrode fingers 32 and 33 on the periphery of the gaps.

Note that, the duty in the finished state in Example 4 was 0.507, and the duty in the finished state in the dummy areas AR3 was 0.707.

Figure 10A:
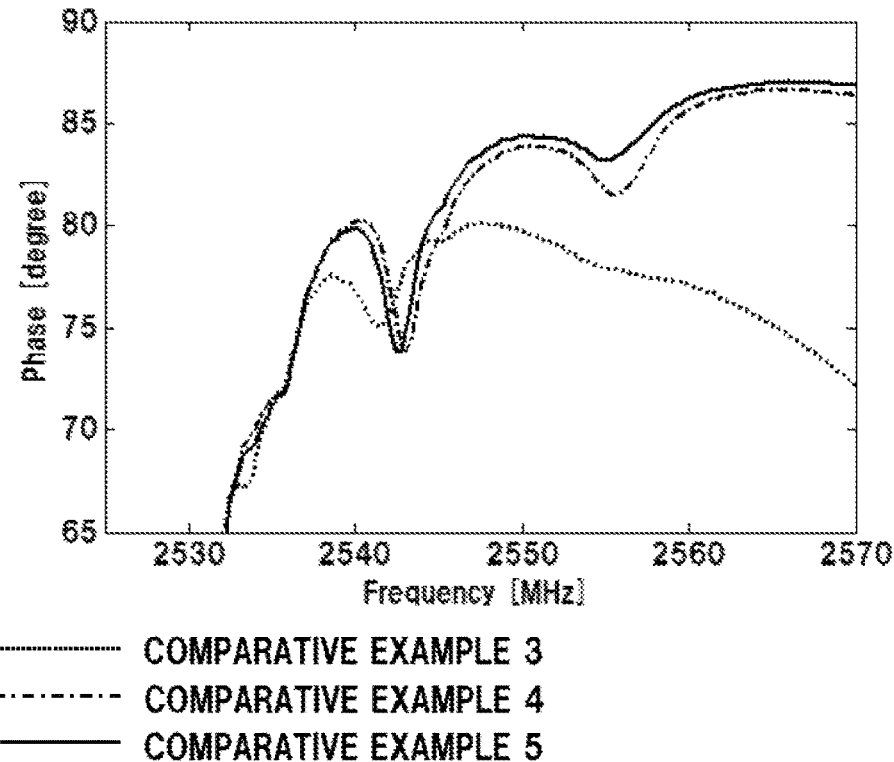
FIG. 10 Graphs showing the frequency characteristics of SAW elements according to an example and comparative examples.
Figure 10B:
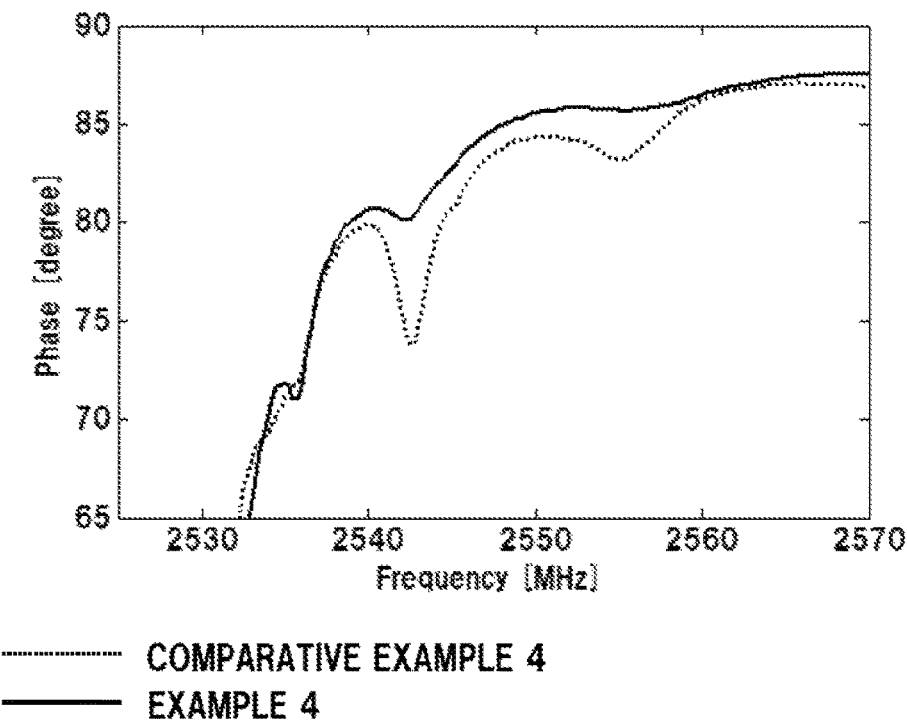

Such a comparison of the phase characteristics in Comparative Examples 3 to 5 will be shown in FIG. 10A, and a comparison of the phase characteristics between Comparative Example 4 and Example 4 will be shown in FIG. 10B. FIGS. 10A and 10B are graphs showing the phase characteristics in the vicinity of the resonance frequency.

In this way, it could be confirmed that bulk wave spurious emission could be suppressed in Example 4 in contrast to the bulk wave spurious emission becoming larger in Comparative Examples 3 to 5.

It was seen that the desired design configuration could be obtained if the electrode finger widths in the gap areas AR2 were widened and also the dummy electrode fingers 33 were widened as in Example 4 and that the bulk wave spurious emission caused by the gap area AR2 was further reduced.

REFERENCE EXAMPLES

Next, in order to confirm the leakage of the acoustic wave in the gaps Gp according to the shapes of the electrode fingers 32, models of electrode fingers 32 were prepared and simulations were carried out. Note that, in order to confirm the pure influence of the leakage of the acoustic wave while excluding the bulk wave spurious emission, the simulation was carried out by using a thick substrate 2 without a support substrate 6.

(Basic Conditions)
In the following reference examples, the common configurations are as follows.
Pitch Pt1 of electrode fingers 32: 0.77 μm (resonance frequency: about 2.58 GHz)
Electrode finger width of electrode fingers 32 in intersection area AR1: 0.385 μm
  Length of gaps Gp: 0.2 um
  Thickness (z-direction) of electrode fingers: 123 nm
  Material of substrate 2: 42° Y-X cut LiTaO₃
The SAW element models in Reference Examples 1 to 4 provided with electrode fingers 32 having the shapes shown in FIGS. 7A to 7D were set. Note that, the widths of the widened portions of the electrode fingers in FIG. 7B to FIG. 7D were set to 0.539 μm.

Figure 11:
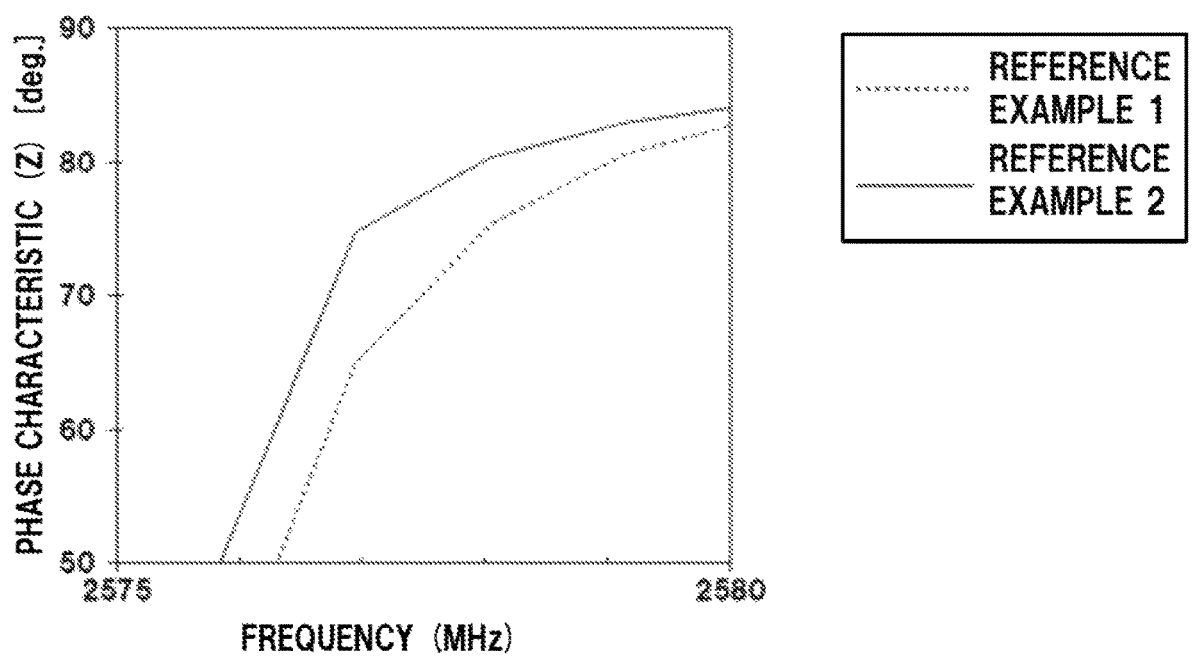
FIG. 11 A graph showing the frequency characteristics of SAW elements according to reference examples.
Figure 12:
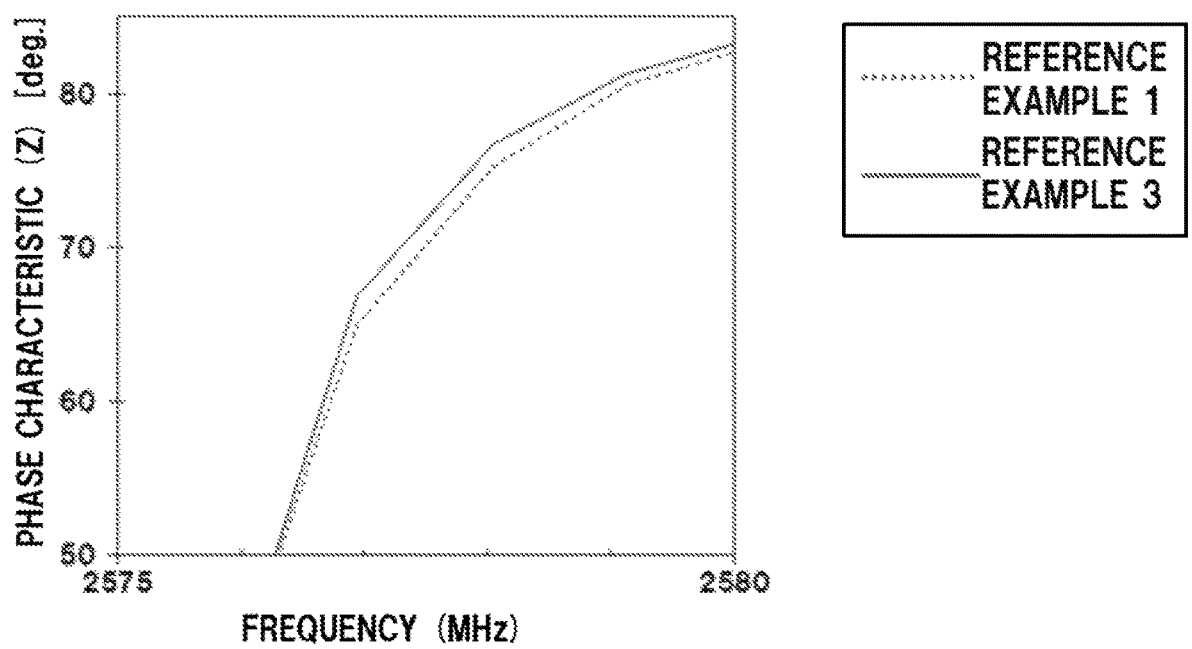
FIG. 12 A graph showing the frequency characteristics of SAW elements according to reference examples.
Figure 13:
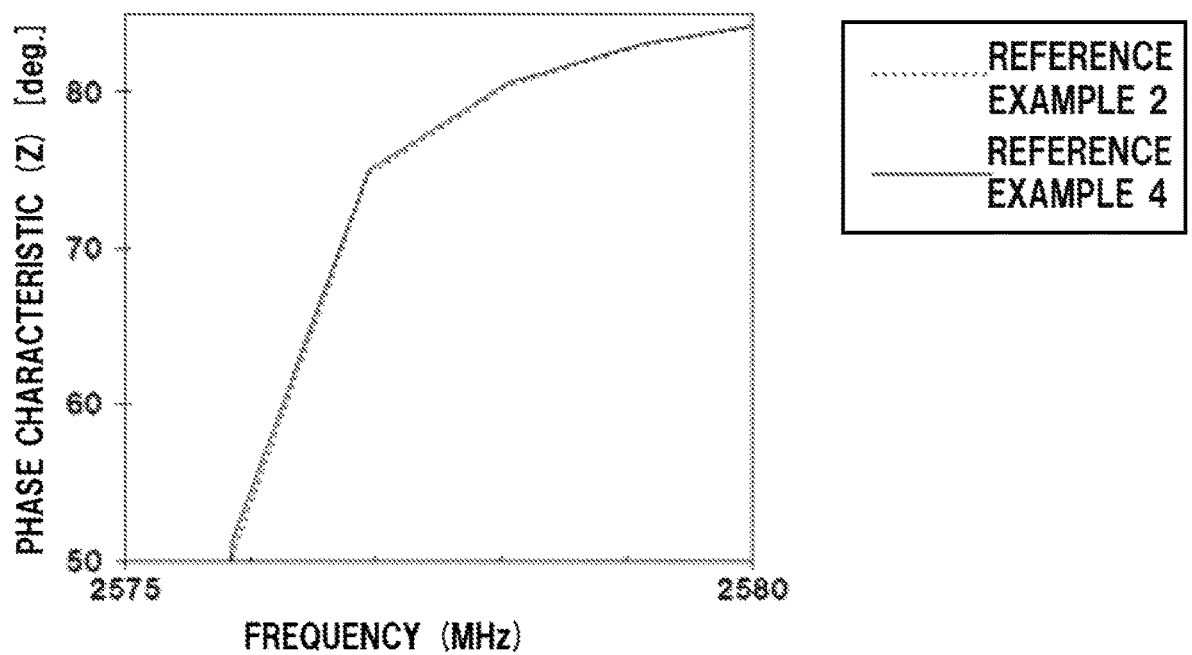
FIG. 13 A graph showing the frequency characteristics of SAW elements according to reference examples.

For such Reference Examples 1 to 4, the results of computation of impedance characteristics by simulation will be shown in FIGS. 11 to 13.

First, a comparison of the phase characteristics between Reference Example 1 and Reference Example 2 will be shown in FIG. 11. As understood, in Reference Example 2, the phase approaches −90° more in the frequency range lower than the resonance frequency, while the phase approaches +90° more in the frequency range higher than the resonance frequency. It can be considered that, by widening the electrode finger widths in the dummy areas AR3 as in Reference Example 2, the regions of the gaps Gp which are the cause of the leakage of the acoustic wave can be effectively made smaller, the leakage of the acoustic wave to the dummy electrode finger 33 side in the upper surface of the substrate 2 and to the internal portion of the substrate 2 (z-direction) is suppressed, and the propagation loss (loss) of SAW is reduced in the frequency range in the vicinity of the resonance frequency.

Next, a comparison of the phase characteristics between Reference Example 1 and Reference Example 3 will be shown in FIG. 12. As shown in FIG. 12, relative to Reference Example 1, Reference Example 3 shows a reduction of propagation loss of SAW in the frequency range in the vicinity of the resonance frequency. Note that, in both of the Reference Examples 2 and 3, the propagation loss of SAW is reduced relative to Reference Example 1. However, it is seen from the comparison between the Reference Example 2 and Reference Example 3 that the reduction of propagation loss of SAW is larger in Reference Example 2 than Reference Example 3.

Next, a comparison of the phase characteristics between Reference Example 2 and Reference Example 4 will be shown in FIG. 13. As understood, in Reference Example 4, even compared with Reference Example 2 having much higher effects than Reference Example 3, the phase approaches +90° in the frequency range higher than the resonance frequency. It can be considered from this fact that, by widening the electrode finger widths in the gap areas AR2 in addition to the widening in the dummy areas AR3, the regions of the gaps Gp which are the cause of the leakage of the acoustic wave can be effectively made smaller, and the propagation loss of SAW can be reduced.

As confirmed from the above description, without regard as to the sizes of the gaps, by increasing the widths of the electrode fingers 32 in at least a portion at the outside of the intersection area AR1, the leakage itself of the acoustic wave can be suppressed. It was confirmed from this that, even in a SAW element 1 using a bonded substrate, increasing the widths of the electrode fingers 32 in at least a portion at the outside of the intersection area AR1 is useful to suppress the leakage wave itself and to suppress the influence of the bulk wave spurious emission.

Note that, it is possible to extract inventions of the following other concepts from the Description.

(Other Invention 1)

An acoustic wave element including:
a substrate configured by a piezoelectric crystal; and
an IDT electrode on an upper surface of the substrate, including
a first bus bar connected to a first potential,
a second bus bar connected to a second potential and arranged with a space in a first direction from the first bus bar,
a plurality of first electrode fingers connected to the first bus bar and extending toward the second bus bar side,
a plurality of second electrode fingers connected to the second bus bar and extending toward the first bus bar side, and
a second dummy electrode finger connected to the second bus bar and facing a tip end of one of the first electrode fingers through a gap, wherein,
in at least one of the second electrode fingers, a width in a region on a side closer to the second bus bar than a first virtual line connecting the tip ends of the plurality of first electrode fingers is larger than a width in a region on a side closer to the first bus bar than the first virtual line.

(Other Invention 2)

The acoustic wave element according to the other invention 1, wherein
the IDT electrode further includes a first dummy electrode finger connected to the first bus bar and facing a tip end of one of the second electrode fingers through a gap, and
in at least one of the first electrode fingers, a width in a region on a side closer to the first bus bar than a second virtual line connecting the tip ends of the plurality of second electrode fingers is larger than a width in a region on a side closer to the second bus bar than the second virtual line.

(Other Invention 3)

The acoustic wave element according to the other invention 1 or 2, wherein the second dummy electrode finger is wider than the width of the one of the second electrode fingers in a region on a side closer to the first bus bar than the first virtual line.

Even in a case where the SAW element does not use a bonded substrate, as shown in FIGS. 11 to 13, by providing widened portions in the widths of the electrode fingers on the outside of the intersection area, the leakage of the acoustic wave can be suppressed.

REFERENCE SIGNS LIST

1: SAW element (acoustic wave element), 2: substrate, 3: IDT electrode, 31 bus bar electrode, 32: electrode finger, 32a: first electrode finger, 32b: second electrode finger, 33: dummy electrode finger, 33a: first dummy electrode finger, 33b: second dummy electrode finger, 4: reflector, L1: first virtual line, L2: second virtual line, LD1: first dummy virtual line, LD2: second dummy virtual line, AR1: intersection area, AR2: gap region, and AR3: dummy area

The invention claimed is:
1. An acoustic wave element, comprising:
a substrate configured by a piezoelectric crystal;
an IDT electrode on an upper surface of the substrate, comprising
a first bus bar connected to a first potential,
a second bus bar connected to a second potential and arranged with a space in a first direction from the first bus bar,
a plurality of first electrode fingers connected to the first bus bar and extending toward a side of the second bus bar,
a plurality of second electrode fingers connected to the second bus bar and extending toward a side of the first bus bar,
a first dummy electrode finger connected to the first bus bar and facing a tip end of one of the second electrode fingers through a gap, and
a second dummy electrode finger connected to the second bus bar and facing a tip end of one of the first electrode fingers through a gap; and a support substrate which is joined to a lower surface of the substrate, comprising a larger thickness than the substrate, and is made of a material having a smaller thermal expansion coefficient than the substrate, wherein a width of at least one of the first electrode fingers, the second electrode fingers, the first dummy electrode finger, and the second dummy electrode finger outside of an intersection area surrounded by a first virtual line connecting the tip ends of the plurality of first electrode fingers and by a second virtual line connecting the tip ends of the plurality of second electrode fingers is wider than widths of the first electrode fingers and the second electrode fingers in the intersection area, in at least one of the second electrode fingers, the width at all positions in a region from the first virtual line to the second bus bar is wider than the width in the intersection area, and at least one of the second electrode fingers extends lineally.

2. The acoustic wave element according to claim 1, wherein the frequency of the acoustic wave excited by the IDT electrode is equal to 2.4 GHz or more.

3. The acoustic wave element according to claim 1, wherein the second dummy electrode finger is wider than the widths of the second electrode fingers in a region on the side closer to the first bus bar than the first virtual line.

4. The acoustic wave element according to claim 1, wherein, in the at least one of the second electrode fingers, the region from the first virtual line to the second bus bar is a dummy area, and an electrode finger width in a region on the side closer to the second bus bar than the second dummy virtual line is wider than the width in the dummy area.

5. The acoustic wave element according to claim 1, wherein, in at least one of the first electrode finger, the electrode finger width in a first dummy area between the second virtual line and a first dummy virtual line connecting tip ends of a plurality of the first dummy electrode fingers is wider than the width in the intersection area, and the electrode finger width in a region on the side closer to the first bus bar than the first dummy virtual line is wider than the width in the first dummy area.

6. The acoustic wave element according to claim 1, further comprising:

reflectors on the two sides of the IDT electrode in a second direction perpendicular to the first direction, wherein the IDT electrode comprises, on the side closest to one of the reflectors in the second direction, a third electrode finger connected to the first bus bar and extending toward the second bus bar side, and a third dummy electrode finger connected to the second bus bar and facing the tip end of the third electrode finger through a gap, at least one of the third electrode finger and the third dummy electrode finger is thinner than the widths of the second electrode fingers in a region on the side closer to the first second bus bar than the first virtual line.

7. The acoustic wave element according to claim 1, further comprising reflectors on the two sides of the IDT electrode in a second direction perpendicular to the first direction, wherein a gap in the first direction between an electrode finger among the plurality of first electrode fingers neighboring the reflector in the second direction and the second dummy electrode finger facing the electrode finger is large compared with the gap between another electrode finger and dummy electrode finger.

8. An acoustic wave device comprising:
the acoustic wave element according to claim 1, and
a circuit board on which the acoustic wave element is mounted.

* * * * *